(12) United States Patent
Yoshimura et al.

(10) Patent No.: US 8,268,673 B2
(45) Date of Patent: Sep. 18, 2012

(54) STACKED ELECTRONIC COMPONENT AND MANUFACTURING METHOD THEREOF

(75) Inventors: Atsushi Yoshimura, Yokosuka (JP); Naoyuki Komuta, Oita (JP); Hideo Numata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/137,097

(22) Filed: Jul. 20, 2011

(65) Prior Publication Data

US 2011/0281396 A1    Nov. 17, 2011

Related U.S. Application Data

(62) Division of application No. 12/011,253, filed on Jan. 25, 2008, now Pat. No. 8,008,763, which is a division of application No. 11/132,290, filed on May 19, 2005, now Pat. No. 7,629,695.

(30) Foreign Application Priority Data

May 20, 2004 (JP) ................. P2004-150046
May 20, 2004 (JP) ................. P2004-150047

(51) Int. Cl.
| | |
|---|---|
| H01L 21/00 | (2006.01) |
| H01L 23/48 | (2006.01) |
| H01L 23/52 | (2006.01) |
| H01L 29/40 | (2006.01) |
| H01L 23/02 | (2006.01) |
| H01L 23/14 | (2006.01) |
| H01L 23/34 | (2006.01) |
| H01L 23/29 | (2006.01) |
| H01L 25/11 | (2006.01) |
| H01L 23/31 | (2006.01) |

(52) U.S. Cl. ........ 438/109; 438/118; 438/126; 438/127; 257/686; 257/690; 257/702; 257/725; 257/738; 257/777; 257/783; 257/784; 257/793; 257/E25.027; 257/E23.119; 257/E23.127

(58) Field of Classification Search ........................ None
See application file for complete search history.

(56) References Cited

U.S. PATENT DOCUMENTS 5,220,200 A    6/1993  Blanton
(Continued)

FOREIGN PATENT DOCUMENTS

CN    1270417 A    10/2000
(Continued)

OTHER PUBLICATIONS

Yoshimura et al., U.S. Appl. No. 11/081,596, filed Mar. 17, 2005.
(Continued)

*Primary Examiner* — Hoang-Quan Ho
(74) *Attorney, Agent, or Firm* — Finnegan, Henderson, Farabow, Garrett & Dunner, L.L.P.

(57) ABSTRACT

A stacked electronic component comprises a first electronic component adhered on a substrate via a first adhesive layer, and a second electronic component adhered by using a second adhesive layer thereon. The second adhesive layer has a two-layer structure formed by a same material and having different modulus of elasticity. The second adhesive layer of the two-layer structure has a first layer disposed at the first electronic component side and a second layer disposed at the second electronic component side. The first layer softens or melts at an adhesive temperature. The second layer maintains a layered shape at the adhesive temperature. According to the stacked electronic component, occurrences of an insulation failure and a short circuiting are prevented, and in addition, a peeling failure between the electronic components, an increase of a manufacturing cost, and so on, can be suppressed.

20 Claims, 16 Drawing Sheets

U.S. PATENT DOCUMENTS

| | | |
|---|---|---|
| 6,100,594 A | 8/2000 | Fukui et al. |
| 6,333,562 B1 | 12/2001 | Lin |
| 6,352,879 B1 | 3/2002 | Fukui et al. |
| 6,353,263 B1 | 3/2002 | Dotta et al. |
| 6,400,007 B1 | 6/2002 | Wu et al. |
| 6,657,290 B2 | 12/2003 | Fukui et al. |
| 6,759,307 B1 | 7/2004 | Yang |
| 2002/0024127 A1 | 2/2002 | Sakuraba et al. |
| 2002/0096755 A1 | 7/2002 | Fukui et al. |
| 2002/0096785 A1 | 7/2002 | Kimura |
| 2003/0038374 A1 | 2/2003 | Shim et al. |
| 2003/0042615 A1 | 3/2003 | Jiang et al. |
| 2003/0189259 A1 | 10/2003 | Kurita et al. |
| 2005/0046005 A1 | 3/2005 | Bowen |
| 2005/0205981 A1 | 9/2005 | Yoshimura et al. |

FOREIGN PATENT DOCUMENTS

| | | |
|---|---|---|
| EP | 1 045 443 A2 | 10/2000 |
| JP | 08-288455 | 11/1996 |
| JP | 2000-144072 A | 5/2000 |
| JP | 2001-217384 | 8/2001 |
| JP | 2002-222913 | 8/2002 |
| JP | 2003-179200 | 6/2003 |
| JP | 2003-218316 | 7/2003 |
| JP | 2004-072009 | 3/2004 |
| JP | 2004-193363 | 7/2004 |

OTHER PUBLICATIONS

Office Action issued by the Chinese Patent Office on Jun. 7, 2007, for Chinese Patent Application No. 200510070829X.

Office Action issued by the Japanese Patent Office on Feb. 26, 2008, for Japanese Patent Application No. 2005-126443.

Office Action issued by the Chinese Patent Office on May 22, 2009, for Chinese Patent Application No. 2008101097899, and English-language translation thereof.

STACKED ELECTRONIC COMPONENT AND MANUFACTURING METHOD THEREOF

CROSS-REFERENCE TO THE INVENTION

This is a divisional application of U.S. patent application Ser. No. 12/011,253, filed Jan. 25, 2008 now U.S. Pat. No. 8,008,763, which is a divisional application of U.S. Ser. No. 11/132,290, filed May 19, 2005 (now U.S. Pat. No. 7,629,695 B2, issued Dec. 8, 2009) which are incorporated herein by reference.

This application is based upon and claims the benefits of priorities from the prior Japanese Patent Application No. 2004-150046 and Japanese Patent Application No. 2004-150047, filed on May 20, 2004, respectively; the entire contents of which are incorporated herein by reference.

BACKGROUND

1. Field of the Invention

The present invention relates to a stacked electronic component constituted by stacking a plurality of electronic components, and a manufacturing method thereof.

2. Description of the Related Art

Recently, to realize a miniaturization and a high-density mounting, and so on, of semiconductor devices, a stacked-type multi chip package in which a plurality of semiconductor elements (semiconductor chip) are stacked and sealed in one package is put into practical use. In the stacked-type multi chip package, the plurality of semiconductor elements are stacked sequentially on a circuit board via an adhesive such as a die attach material. Electrode pads of the respective semiconductor elements are electrically connected to electrode portions of the circuit board via bonding wires. Such a stacked structure is packaged with a sealing resin, and thereby, the stacked-type multi chip package is constituted.

In the stacked-type multi chip package as stated above, when the semiconductor element at an upper side is smaller than the semiconductor element at a lower side, the semiconductor element at the upper side does not interfere with the bonding wire of the semiconductor element at the lower side. However, in such a structure, the applicable semiconductor element is largely restricted. Therefore, it is proceeding that an applicable scope of the stacked-type multi chip package is spread to the semiconductor elements of the same shape, or further to the structure in which a larger semiconductor element is stacked at the upper side than that of the lower side (for example, refer to Japanese Patent Laid-open Application No. 2001-217384).

At this time, when the same shaped semiconductor element or a large shaped semiconductor element is stacked at the upper side compared to the lower side, the bonding wire of the semiconductor element at the lower side may be in contact with the semiconductor element at the upper side. Herewith, it becomes important to prevent occurrences of an insulation failure, a short circuiting, and so on, caused by the contact of the bonding wire. Consequently, a spacer in which a thickness is set so that a lower surface of the semiconductor element at the upper side is to be higher than a height of the bonding wire connected to the semiconductor element at the lower side, is disposed between the upper and lower semiconductor elements (for example, refer to Japanese Patent Application Laid-open No. 2003-179200, Japanese Patent Laid-open Application No. 2003-218316).

However, a usage of such a thick spacer disturbs to make a package (semiconductor device) thinner. Besides, it is considered to give a spacer function to an adhesive layer in itself between the semiconductor elements, but in this case, the package is disturbed to be thinner. It is suggested that an insulating layer is formed at the lower surface side of the semiconductor element at the upper side, and thereby, the occurrences of the insulation failure, the short circuiting, and so on, can be suppressed when the bonding wire of the semiconductor element at the lower side is in contact with the semiconductor element at the upper side (for example, refer to Japanese Patent Laid-open Application No. Hei. 8-288455 and Japanese Patent Laid-open Application No. 2002-222913).

In Japanese Patent Laid-open Application No. Hei. 8-288455, a structure in which an insulating resin layer and a fixing resin layer are sequentially formed on the semiconductor element at the lower side, and thereafter, the semiconductor element at the upper side is disposed and fixed, is described. In Japanese Patent Laid-open Application No. 2002-222913, a structure in which an insulating layer composed of a polyimide resin and an adhesive layer composed of an epoxy resin are stacked into a sheet, the sheet is bonded to a rear surface of the semiconductor element at the upper side, and the semiconductor element at the upper side is adhered on the semiconductor element at the lower side by using the adhesive layer of the sheet, is described. An application of this insulating layer shows an effect for the suppression of the insulation failure, the short circuiting, and so on. However, there is an objection that a peeling off is easy to occur between the stacked semiconductor elements caused by, for example, a difference of thermal expansion coefficient between the insulating layer composed of a polyimide resin and the adhesive layer composed of an epoxy resin.

Further, when a larger semiconductor element is stacked at the upper side than that of the lower side, the semiconductor element at the upper side is disposed protruding from the semiconductor element at the lower side, and therefore, below the protruding portion becomes to be in a hollow state. Besides, when the semiconductor elements of the same shape are stacked, the position of the semiconductor element at the upper side is offset, a part thereof becomes to be protruded from the semiconductor element at the lower side. If a wire bonding is performed to the semiconductor element having such protruding portion, a deflection occurs to the semiconductor element by a loading at that time. Such the deflection may be a cause of occurrences of a crack, and so on, of the semiconductor element, and a cause for a connection failure of the bonding wire. Besides, a reliability at a wire connection portion may be deteriorated by diffusing an ultrasonic output at the bonding time, into the hollow portion below the protruding portion.

Incidentally, in the above-mentioned Japanese Patent Laid-open Application No. 2001-217384, there is described the stacked-type semiconductor device in which the semiconductor element at the lower side is mounted on a substrate, then it is resin sealed, and on this resin sealed portion, the semiconductor element at the upper side is mounted, in a structure that a larger semiconductor element than that of the lower side is stacked at the upper side. According to this structure, the resin sealing portion is existing under the semiconductor element at the upper side, and therefore, a bonding failure, the crack of the semiconductor element, and so on, can be prevented, but on the other hand, it is required to perform a resin sealing process after mounting the respective semiconductor elements, and therefore, there is the objections that the number of manufacturing processes or a manufacturing cost is increasing. Further, the respective resin sealing portions becomes to be disturbing factors to make the stacked-type semiconductor device thin or small.

As stated above, in the semiconductor device applying a conventional stacked-type multi chip package structure, the insulating layer provided at the lower surface side of the semiconductor element at the upper side shows an effect for suppressing the insulation failure, the short circuiting, and so on, but it causes the peeling between the elements resulting from the difference of the thermal expansion coefficient between the insulating layer and the adhesive layer, the increase of the manufacturing cost, and so on. Further, when a larger semiconductor element, and so on, is stacked at the upper side than that of the lower side, a part of the semiconductor element at the upper side protrudes from the semiconductor element at the lower side, and below the protruding portion is inevitable to be in the hollow state. The stacked structure with the protruding portion has problems that the crack of the semiconductor element, the connection failure of the wire, and so on, are easy to occur. These problems occur for a stacked-type electronic component in which various electronic components are stacked and packaged as well as for the semiconductor device in which the plural semiconductor elements are stacked.

SUMMARY

Consequently, an object of the present invention is to provide a stacked-type electronic component capable for preventing occurrences of an insulation failure, a short circuiting, and so on, caused by a contact of a bonding wire of the electronic component at the lower side with the electronic component at the upper side, and in addition, suppressing a peeling failure between the electronic components, an increase of a manufacturing cost, and so on, and a manufacturing method thereof. Further, another object of the present invention is to provide a stacked-type electronic component suppressing an occurrence of a failure at a bonding time to the electronic component at the upper side, in a stacked structure having a hollow portion below the electronic component at the upper side, and a manufacturing method thereof.

A stacked electronic component according to an aspect of the present invention comprises a substrate having electrode portions, a first electronic component having first electrode pads connected to the electrode portions via first bonding wires and adhered on the substrate, and a second electronic component having second electrode pads connected to the electrode portions via second bonding wires and adhered on the first electronic component by using an adhesive layer of a two-layer structure formed by a same material and having different modulus of elasticity.

A stacked electronic component according to another aspect of the present invention comprises a substrate having electrode portions, a first electronic component having first electrode pads connected to the electrode portions via first bonding wires and adhered on the substrate, and a second electronic component having second electrode pads connected to the electrode portions via second bonding wires and adhered on the first electronic component via an adhesive layer containing an insulating filler maintaining a solid state for an adhesive temperature and having a portion protruding outside from an outer periphery of the first electronic component, wherein the adhesive layer is filled between the protruding portion of the second electronic component and the substrate, by softened or melted at the adhesive temperature of the second electronic component.

A stacked electronic component according to still another aspect of the present invention comprises a substrate having electrode portions, a first electronic component having first electrode pads connected to the electrode portions via first bonding wires and mounted on the substrate, a second electronic component having second electrode pads connected to the electrode portions via second bonding wires and mounted on the first electronic component and having a portion protruding outside from an outer periphery of the first electronic component, and a insulating columnar body supporting the protruding portion of the second electronic component.

A manufacturing method of a stacked electronic component according to an aspect of the present invention comprises adhering a first electronic component having first electrode pads on a substrate having electrode portions, connecting the electrode portions and the first electrode pads via first bonding wires, adhering a second electronic component having second electrode pads on the first electronic component by using an adhesive layer of a two-layer structure formed by a same material and having different modulus of elasticity, and connecting the electrode portions and the second electrode pads via second bonding wires.

BRIEF DESCRIPTION OF THE DRAWINGS

The present invention will be described with reference to the drawings, but these drawings are provided only for an illustrative purpose and by no means are intended to limit the present invention.

DETAILED DESCRIPTION

Hereinafter, embodiments of the present invention are explained with reference to the drawings. Incidentally, the embodiments of the present invention are described below based on the drawings, but these drawings are provided only for an illustrative purpose and by no means are intended to limit the present invention.

Figure 1:
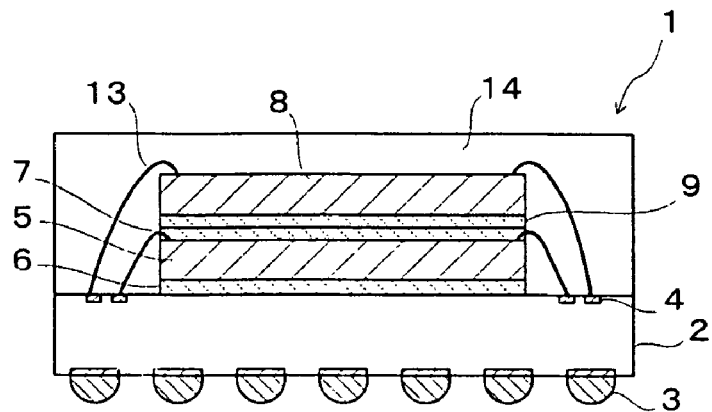
FIG. 1 is a sectional view schematically showing a configuration of a first embodiment of a stacked-type semiconductor device applying a stacked-type electronic component according to the present invention.

FIG. 1 is a sectional view schematically showing a configuration of a first embodiment of a semiconductor device with a stacked-type multi chip structure (stacked-type semiconductor device) applying a stacked-type electronic component of the present invention. A semiconductor device 1 shown in the view has a substrate 2 for mounting elements.

The substrate 2 is capable for mounting electronic components such as semiconductor elements, and has a circuit being electrically connected to electrodes of the semiconductor element, and so on. As such substrate 2, a circuit board in which a circuit (wiring) is formed on a surface or inside of an insulating substrate, a semiconductor substrate, and so on, or a substrate in which an element mounting portion and a circuit portion are integrated, such as a lead frame, and so on, can be used.

The semiconductor device 1 shown in FIG. 1 has a circuit board 2 as the element mounting substrate. As the insulating substrate constituting the circuit board 2, the substrates composed of various insulating materials can be applied, such as a resin substrate, a ceramic substrate, a glass substrate. As the circuit board applying the resin substrate, a multilayer copper clad laminate (multilayer printed circuit board), and so on, can be used. At a lower surface side of the circuit board 2, external connection terminals 3 such as solder bumps are provided.

At an upper surface side of the circuit board 2 being the element mounting surface, electrode portions 4 electrically connected to the external connection terminals 3 via, for example, inner layer wirings (not shown), are provided. The electrode portions 4 are to be wire bonding portions. On the element mounting surface (upper surface) of the circuit board 2, a first semiconductor element 5 as a first electronic component is adhered via a first adhesive layer 6. For the first adhesive layer 6, a general die attach material (die attach film, and so on) is used. First electrode pads (not shown) provided at an upper surface side of the first semiconductor element 5, are electrically connected to the electrode portions 4 of the circuit board 2 via first bonding wires 7.

Figure 2:
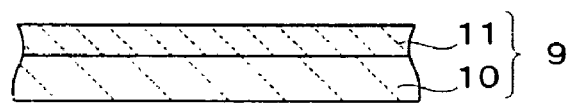
FIG. 2 is a sectional view showing a configuration of an adhesive layer of a two-layer structure used/for adhering a first semiconductor element and a second semiconductor element of the stacked-type semiconductor device shown in FIG. 1.

On the first semiconductor element 5, a second semiconductor element 8 as a second electronic component is adhered via a second adhesive layer 9. The second semiconductor element 8 has the same or a larger shape compared to the first semiconductor element 5. As shown in FIG. 2, the second adhesive layer 9 has a two-layer structure of a first layer 10 disposed at the first semiconductor element 5 side, and a second layer 11 disposed at the second semiconductor element 8 side. The first and second layers 10, 11 are formed by the same material, namely, the same adhesive resin, and have different modulus of elasticity. Here, the modulus of elasticity means that the modulus of elasticity before cured by a heat treatment. Softening or melting temperatures of the first layer 10 and the second layer 11 are different based on the different modulus of elasticity. The first layer 10 softens or melts at an adhesive temperature of the second semiconductor element 8, and the second layer 11 maintains a layered shape for the adhesive temperature.

Namely, the first layer 10 in the second adhesive layer 9 softens or melts at the adhesive temperature of the second semiconductor element 8, and functions as a layer to take in the first bonding wire 7 (here, denoted by a melting layer for convenience). It is preferable that the first layer 10 which functions as the melting layer has a viscosity at the adhesive temperature of 1 kPa·s or more and 100 kPa·s or less. When the viscosity at adhesive time of the first layer 10 is less than 1 kPa·s, it is too soft that the adhesive resin may be protruded from an element end face. Meanwhile, when the viscosity at adhesive time of the first layer 10 is more than 100 kPa·s, it is too hard that, for example, a deformation of the first bonding wire 7, a connection failure, and so on, may occur. It is more preferable that the viscosity at adhesive time of the first layer 10 is in the range of 1 kPa·s to 50 kPa·s, and furthermore, it is desirable to be in the range of 1 kPa·s to 20 kPa·s.

Meanwhile, the second layer 11 maintains the layered shape for the adhesive temperature of the second semiconductor element 8, and functions as an insulating layer preventing occurrences of an insulation failure, a short circuiting, and so on, in accordance with a contact of the second semiconductor element 8 with the first bonding wire 7. The viscosity at the adhesive temperature of the second layer 11 functioning as the insulating layer is preferable to be 130 kPa·s or more. If the viscosity at the adhesive temperature of the second layer 11 is less than 130 kPa·s, it is impossible to maintain the layered shape when the second semiconductor element 8 is adhered to be first semiconductor element 5, and the function as the insulating layer is lost. The viscosity at the adhesive temperature of the second layer 11 is more preferable to be 200 kPa·s or more. However, the function as the adhesive layer may be lost if the viscosity is too high, so the viscosity at the adhesive temperature of the second layer 11 is preferable to be 1000 kPa·s or less.

As a forming material of the second adhesive layer 9 of the two-layer structure as stated-above, a same adhesive resin is used. As the adhesive resin, for example, a thermosetting insulating resin such as an epoxy resin can be cited. The second adhesive layer 9 of the two-layer structure can be obtained, for example, by using the same thermosetting resin varnish, and dry temperatures or dry times are differed when the first layer 10 and the second layer 11 are formed. The adhesive layer 9 of the two-layer structure is used, for example, as an adhesive film when the second semiconductor element 8 is adhered on the first semiconductor element 5.

Figure 3A:
FIG. 3A and FIG. 3B are sectional views showing an example of a manufacturing process of the adhesive layer of the two-layer structure shown in FIG. 2.
Figure 3B:
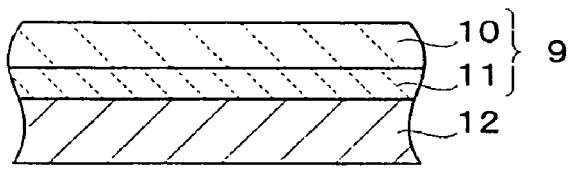

The adhesive layer 9 of the two-layer structure is created, for example, as described below. At first, as shown in FIG. 3A, on a film base material 12 to be a substrate, for example, the epoxy resin varnish (A stage) is coated, and thereafter, the coating layer is dried, for example, at 150° C. to form the second layer 11 in a half-cured state (B stage). Next, as shown in FIG. 3B, on the second layer 11, the same epoxy resin varnish (A stage) is coated again, and this coating layer is dried, for example, at 130° C. to form the first layer 10 in the half-cured state (B stage). Incidentally, the adhesive layer 9 of the two-layer structure can be formed by sequentially coating the epoxy resin varnish, and so on, on the lower surface of the second semiconductor element 8.

As stated above, the epoxy resin varnish is dried at the different temperatures, and thereby, the first layer 10 and the second layer 11 having different room temperature modulus of elasticity, furthermore the softening or the melting temperature, can be obtained. Concretely, when it is heated with the temperature at the dry temperature or more (130° C. or more) of the first layer 10 and at less than the dry temperature (less than 150° C.) of the second layer 11, the layered shape of the second layer 11 is maintained. Meanwhile, only the first layer 10 is softened or melted. Consequently, by setting the adhesive temperature of the second semiconductor element 8 within the above-stated temperature range (for example, 130° C. or more and less than 150° C.), it is possible to soften or melt the first layer 10 at the adhesive time while functioning the second layer 11 as the insulating layer with maintaining the layered shape thereof.

Incidentally, instead of the above-stated control of the dry temperature of the epoxy resin varnish, it is possible to obtain the adhesive layer 9 of the two-layer structure having the first layer 10 and the second layer 11 by differing the dry time after the coating of the epoxy resin varnish. In this case, for example, after the epoxy resin varnish (A stage) is coated on the film base material 12 to be the substrate, this coating layer is dried at a predetermined temperature to form the second layer 11 in the half-cured state (B stage). Next, the epoxy resin varnish (A stage) is coated again on the second layer 11, and this coating layer is dried at the same temperature with the second layer 11 and for a shorter time than the second layer 11. By this means, the first layer 10 and the second layer 11 having different room temperature modulus of elasticity and furthermore, the softened or melted temperatures can be obtained.

The concrete modulus of elasticity of the first layer 10 and the second layer 11 are not particularly restricted, but it is good to have the difference in the viscosity at the adhesive temperature as stated above. To make the first layer 10 function as the melting layer and to make the second layer 11 function as the insulating layer, it is preferable for the second layer 11 to have a larger room temperature modulus of elasticity than the first layer 10. Further, to use the adhesive layer 9 of the two-layer structure as the adhesive film, the adhesive film may be bonded at a rear surface of the second semiconductor element 8 separated into pieces, but it is preferable to be bonded at a stage of a semiconductor wafer before separated into pieces to be the second semiconductor element 8. Herewith, the number of manufacturing processes or a manufacturing cost of the second semiconductor element 8 can be eliminated.

When the adhesive film composed of the adhesive layer 9 of the two-layer structure is bonded to the semiconductor wafer, the semiconductor wafer including the adhesive film is to be dicing. Therefore, the respective layers 10,11 composing the adhesive layer 9 of the two-layer structure are preferable to have the room temperature modulus of elasticity possible to be dicing processed, concretely, the room temperature modulus of elasticity in the range of 500 MPa or more and 1200 MPa or less, respectively. When the room temperature modulus of elasticity of the respective layers 10, 11 are less than 500 MPa, a processing efficiency, and so on, at the time of dicing is lowered. Meanwhile, when the room temperature modulus of elasticity are more than 1200 MPa, the function as the adhesive layer 9 is lowered. It is preferable that the room temperature modulus of elasticity of the first and second layers 10, 11 are to be set as satisfying the above-stated condition, and in addition, the room temperature modulus of elasticity of the second layer 11 is set to be larger than that of the first layer 10.

On the second semiconductor element 8 adhered on the first semiconductor element 5 by using the adhesive layer 9 of the two-layer structure, second bonding wires 13 are connected to second electrode pads (not shown) provided at an upper surface side thereof. Further, the second bonding wires 13 are electrically connected to the electrode portions 4 of the circuit board 2. The first and second semiconductor elements 5, 8 stacked and disposed on the circuit board 2 are sealed by using a sealing resin 14, for example, such as a epoxy resin, and thereby, the semiconductor device 1 with the stacked-type multi chip package structure is constituted.

Incidentally, in FIG. 1, the structure in which two semiconductor elements 5, 8 are stacked is described, but the number of stacks of the semiconductor elements are not limited to these. The number of elements to be stacked may be three or more. When three or more semiconductor elements are stacked to constitute the semiconductor device, the adhesive layer of the two-layer structure, namely, the adhesive layer having the first layer softening or melting and the second layer maintaining the layered shape at the adhesive temperature of the semiconductor element, is used to adhere between the semiconductor element.

Figure 4A:
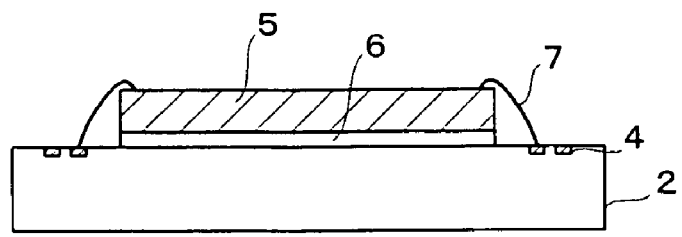
FIG. 4A, FIG. 4B and FIG. 4C are sectional views showing a manufacturing process of a substantial part of the stacked-type semiconductor device according to the first embodiment of the present invention.
Figure 4B:
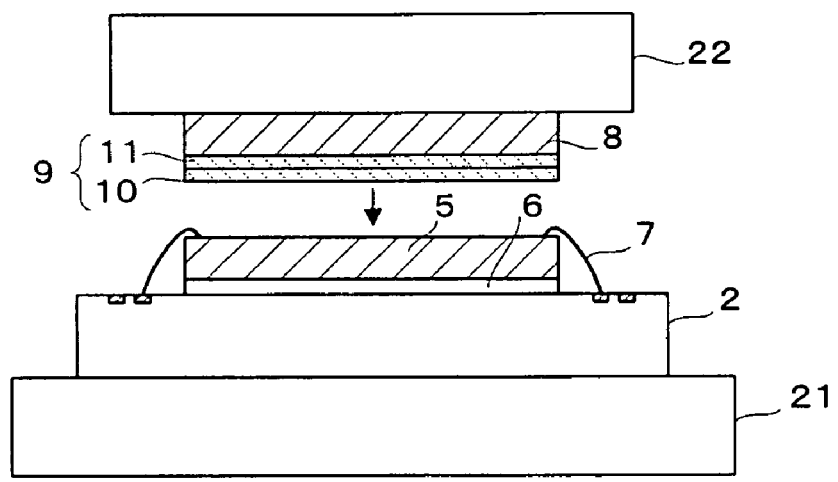

The above-stated semiconductor device 1 according to a first embodiment is created, for example, as stated below. A manufacturing process of the semiconductor device 1 is described with reference to FIG. 4A to FIG. 4C. As shown in FIG. 4A, the first semiconductor element 5 is adhered on the circuit board 2 by using a first adhesive layer 6. Subsequently, a wire bonding process is performed, and the electrode portions 4 of the circuit board 2 and the electrode pads of the first semiconductor element 5 are electrically connected with the first bonding wires 7. Next, as shown in FIG. 4B, the circuit board 2 to which the first semiconductor element 5 is adhered is placed on a heating stage 21.

Meanwhile, at a lower surface side of the second semiconductor element 8, the adhesive layer (adhesive film of the two-layer structure) 9 of the two-layer structure created based on, for example, the manufacturing process shown in FIG. 3A and FIG. 3B is bonded. At this time, the adhesive film 9 of the two-layer structure is bonded so that the second layer 11 functioning as the insulating layer is to be disposed at the second semiconductor element 8 side. The adhesive film 9 of the two-layer structure may be bonded at the stage of the semiconductor wafer as stated above. At this time, the adhesive film 9 of the two-layer structure may be the one integrated with a dicing tape. The semiconductor wafer to which the adhesive film 9 of the two-layer structure is bonded, is performed the dicing process, and thereafter, it is provided to the manufacturing process of the semiconductor device 1 shown in FIG. 4A to FIG. 4C. The second semiconductor element 8 to which the adhesive layer 9 of the two-layer structure is bonded, is held by a mounting tool 22. The mounting tool 22 includes a suction holding means and a heating mechanism of the semiconductor element 8.

Figure 4C:
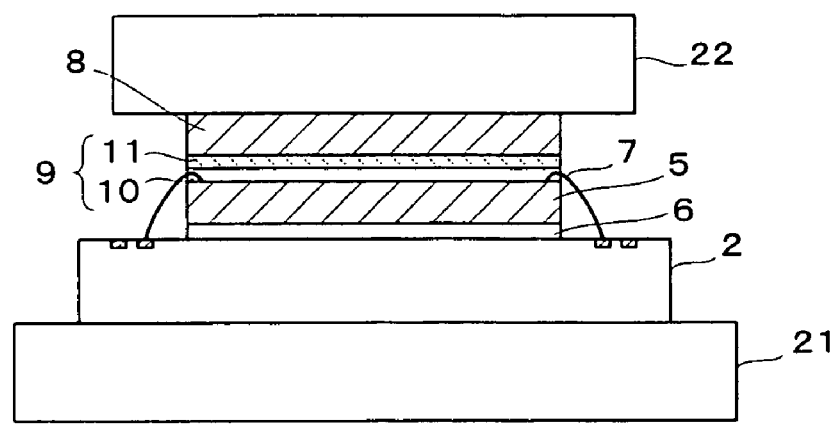

Next, as shown in FIG. 4C, the second semiconductor element 8 held by the mounting tool 22 is positioned relative to the first semiconductor element 5. The mounting tool 22 is lowered to press the second adhesive layer 9 to the first semiconductor element 5, and the second adhesive layer 9 is heated by using at least one of the heating stage 21 or the mounting tool 22. A heating temperature at this time is the dry temperature of the first layer 10 or more and less than the dry temperature of the second layer 11. As stated above, when the second layer 11 is dried at 150° C., and the first layer 10 is dried at 130° C., the heating temperature of the second adhesive layer 9 (adhesive temperature of the second semiconductor element 8) is set as, for example, 140° C.±5° C.

When the second adhesive layer 9 is heated at the above-stated temperature, it is adhered to the first semiconductor element 5 while taking the first bonding wire 7 into the first layer 10 because the first layer 10 is, for example, melted. Herewith, it is prevented that the first bonding wire 7 is crashed to occur the deformation, the connection failure, and so on. Meanwhile, the second layer 11 maintains the layered shape for the above-stated heating temperature, and therefore, the contact of the first bonding wire 7 taken into the first layer 10 with the second semiconductor element 8 can be prevented. The second layer 11 functions as the insulating layer. Herewith, the occurrences of the insulation failure, the short circuiting, and so on, caused by the contact of the first bonding wire 7 with the second semiconductor element 8 can be effectively prevented.

In the adhesive layer 9 of the two-layer structure, a thickness of the first layer 10 is set appropriately in accordance with a height of the first bonding wire 7. For example, when the height of the first bonding wire 7 (maximum height on the first semiconductor element 5) is 60 μm±15 μm, the thickness of the first layer 10 softening or melting at the heating temperature, is preferable to be set as 75 μm±15 μm. Meanwhile, a thickness of the second layer 11 maintaining the layered shape for the heating temperature, is preferable to be set, for example, in the range of 5 μm to 15 μm. This thickness includes a tolerance. When the thickness of the second layer 11 is too thick, the semiconductor device 1 is disturbed to become thinner.

After the second semiconductor element 8 is adhered on the first semiconductor element 5 by using the second adhesive layer 9, a wire bonding process in which the electrode portions 4 of the circuit board 2 and the electrode pads of the second semiconductor element 8 are electrically connected by second bonding wires 13 is performed. Subsequently, the forming process of the external connection terminals 3, the resin sealing process with the sealing resin 14, and so on, are performed, and thereby, the semiconductor device 1 with the stacked-type multi chip package structure can be obtained.

Here, the modulus of elasticity after the second adhesive layer 9 is performed the heating process to be cured is preferable to be 40 MPa or more at 175° C., and 1 MPa or more at 260° C. When the modulus of elasticity of the second adhesive layer (cured resin layer) 9 after cure at 175° C. is less than 40 MPa, the deformation of the second semiconductor element 8 in the wire bonding process becomes large, and the crack, and so on, is easy to occur in the second semiconductor element 8. The deformation of the second semiconductor element 8 at the wire bonding time is preferable to be 15 μm or less.

Figure 5:
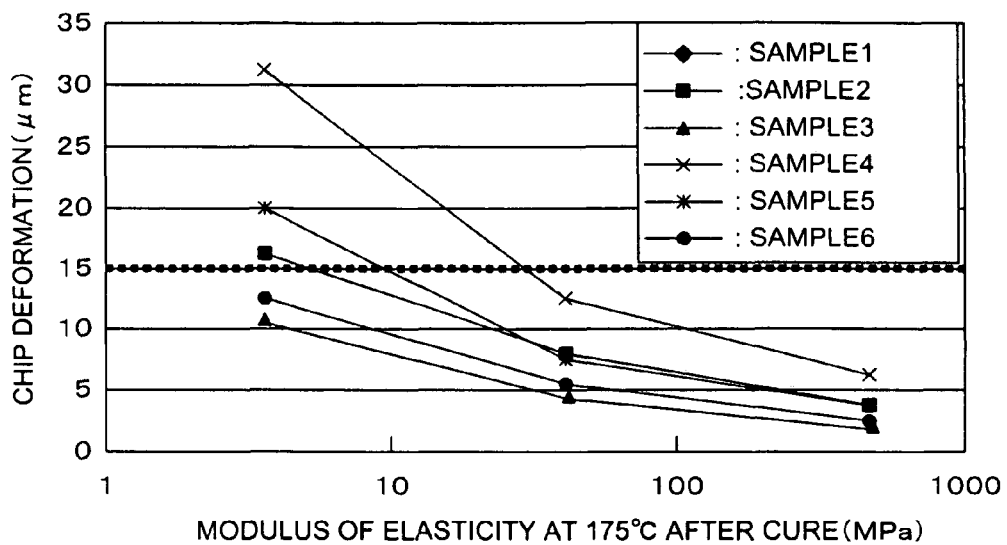
FIG. 5 is a view showing a relation of a modulus of elasticity of a curing resin layer at 175° C. and a deflection of the semiconductor element at the time of wire bonding.

FIG. 5 shows a relation between the modulus of elasticity of the cured resin layer 9 at 175° C. and the deformation of the second semiconductor element 8 at the time of the wire bonding. In FIG. 5, a sample 1 has a thickness of the semiconductor element (chip) of 50 μm and a thickness of a joining layer of 60 μm. A sample 2 has a chip thickness of 70 μm and a joining layer thickness of 60 μm, a sample 3 has the chip thickness of 90 μm and the joining layer thickness of 60 μm. A sample 4 has the chip thickness of 50 μm and the joining layer thickness of 85 μm, a sample 5 has the chip thickness of 70 μm and the joining layer thickness of 85 μm, and a sample 6 has the chip thickness of 90 μm and the joining layer thickness of 85 μm. As shown in FIG. 5, the modulus of elasticity of the cured resin layer 9 at 175° C. is set to be 40 MPa or more, and then, the deformation of the second semiconductor element 8 at the wire bonding process can be made small.

Figure 6:
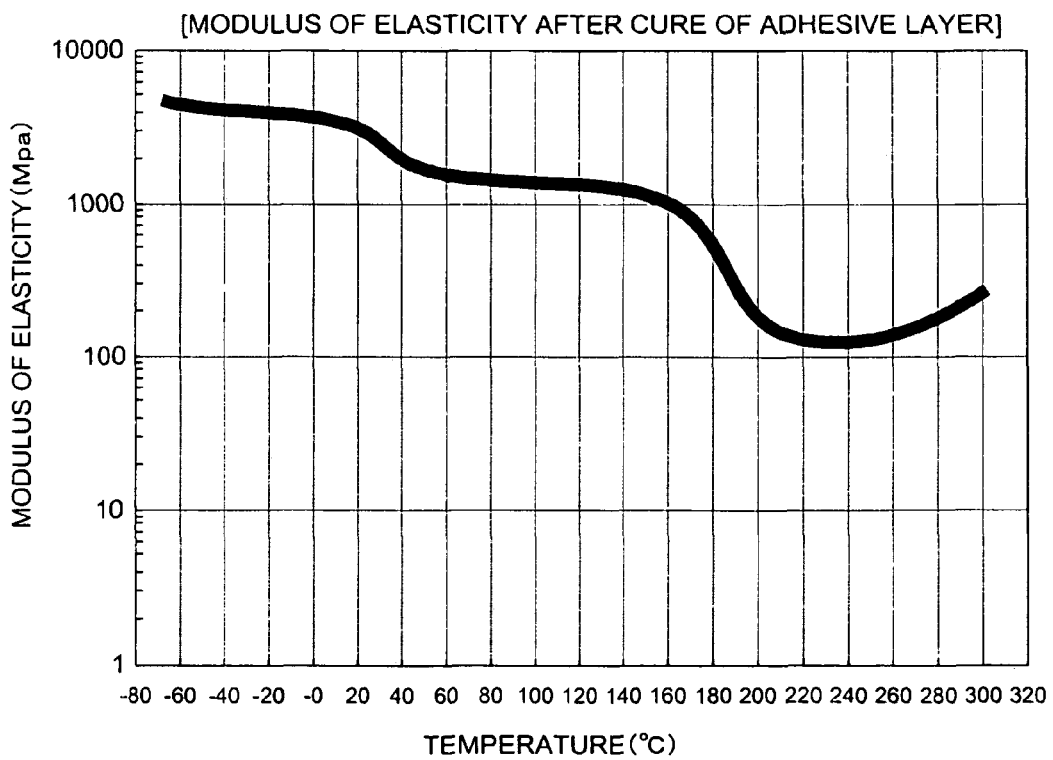
FIG. 6 is a view showing an example of a temperature change of the modulus of elasticity of the curing resin layer.

Besides, when the semiconductor device 1 is mounted on a mother board, and so on, the semiconductor device 1 is reflowed, for example, at 260° C. At this time, the semiconductor device 1 is moisture adsorption, and a vapor explosion may occur depending on a state of the semiconductor device 1. A vapor pressure at 260° C. is 1 MPa. Consequently, the modulus of elasticity of the cured resin layer 9 at 260° C. is preferable to be 1 MPa or more. Herewith, the vapor explosion at a soldering reflow time can be prevented. The modulus of elasticity of the cured resin layer 9 at 260° C. is more preferable to be 10 MPa or more, and it is further more preferable to be 50 MPa or more. FIG. 6 shows an example of a temperature change of the modulus of elasticity of the cured resin layer (dynamic storage modulus of elasticity measured at a frequency of 1 Hz). The modulus of elasticity of a resin is rapidly lowered after exceeding a glass transition point. Therefore, it becomes important that the modulus of elasticity at 260° C. is set to be 1 MPa or more.

As stated above, by using the adhesive layer 9 of the two-layer structure having different modulus of elasticity, it becomes possible to prevent the deformation of the first bonding wire 7, the connection failure, furthermore, the contact of the first bonding wire 7 with the second semiconductor element 8, and so on, and to adhere the second semiconductor element 8 to the first semiconductor element 5 well with low cost. Moreover, the adhesive layer 9 of the two-layer structure is formed by the same material, the peeling between elements, and so on, do not occur after the adhesive process of the second semiconductor element 8, and further, it is possible to suppress the increase in the number of manufacturing processes or the manufacturing cost required for the adhesion.

Namely, in a conventional stacked structure using the insulating layer and the adhesive layer, the peeling between elements, and so on, are invited caused by the difference of thermal expansion coefficients, and so on, between the insulating layer and the adhesive layer. However, in the adhesive layer 9 of the two-layer structure formed by the same material, the peeling between elements may not occur based on the difference of the thermal expansion coefficients, and so on. Further, by adhering the first semiconductor element 5 and the second semiconductor element 8 with the adhesive layer 9 of the two-layer structure, the adhesive process in itself can be made to be the same as the conventional adhesive process using a die attach film of a one-layer structure, and therefore, the increases in the number of manufacturing processes and the manufacturing cost required for the adhesion is not invited. Namely, the number of processes or the cost required for forming the conventional insulating layer can be eliminated.

Besides, the contact of the first bonding wire 7 with the second semiconductor element 8 is prevented by the second layer 11 functioning as the insulating layer, and therefore, the thickness of the second adhesive layer 9 can be set within the range that the first layer 10 can take in the first bonding wire 7 without making it deformed. Consequently, the semiconductor device 1 can be made thinner compared to the conventional stacked-type semiconductor device in which the space between the first semiconductor element and the second semiconductor element is set by a spacer. Namely, the semiconductor device 1 with the stacked-type multi chip package structure in which both thin and the improved reliability are obtained can be realized.

Figure 7:
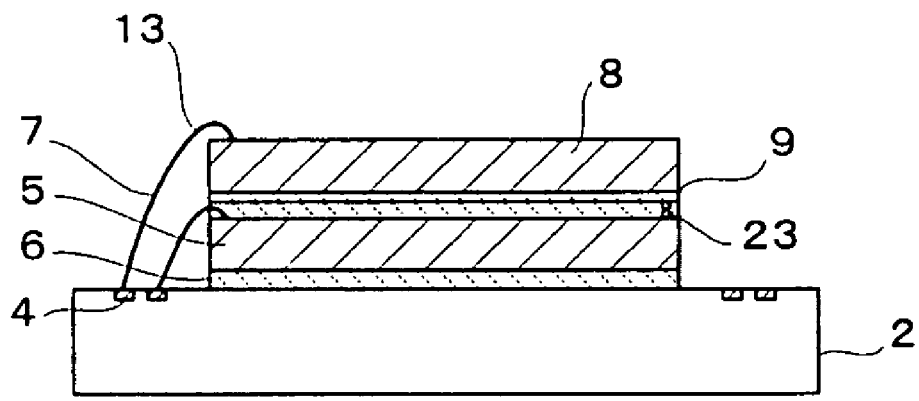
FIG. 7 is a sectional view showing a configuration example of the stacked-type semiconductor device according to the first embodiment to which a stud bump is applied.

In the above-stated embodiment, a distance from the first semiconductor element 5 to the second layer 11 functioning as the insulating layer, in other words, the height of the portion where the first bonding wire 7 is disposed is defined by the thickness of the first layer 10 functioning as the adhesive. For example, as shown in FIG. 7, a stud bump 23 is formed on the electrode pad which is not used for the connection of the first semiconductor element 5, and thereby, the distance between the first and second semiconductor elements 5, 8 may be defined. Herewith, a damage, a deformation, and so on, caused by the contact of the first bonding wire 7 with the second layer 11 may be prevented more certainly.

In the semiconductor device 1 shown in FIG. 7, the stud bump 23 composed of a metallic material, a resin material, and so on, is formed on the electrode pad not used for the connection of the first semiconductor element 5, namely, on a non-connection pad. The height of the stud bump 23 is set to be higher than the height of the first bonding wire 7. The second semiconductor element 8 does not come down lower than the stud bump 23, because the stud bump 23 functions as the spacer. Consequently, the contact of the first bonding wire 7 with the second layer 11 is prevented, and it becomes possible to prevent the damage, the deformation, and so on, of the first bonding wire 7 more certainly. The forming of the stud bump 23 may be at one position, but it is more preferable to dispose at three positions or more passing a gravity point of the first semiconductor element 5.

Figure 8:
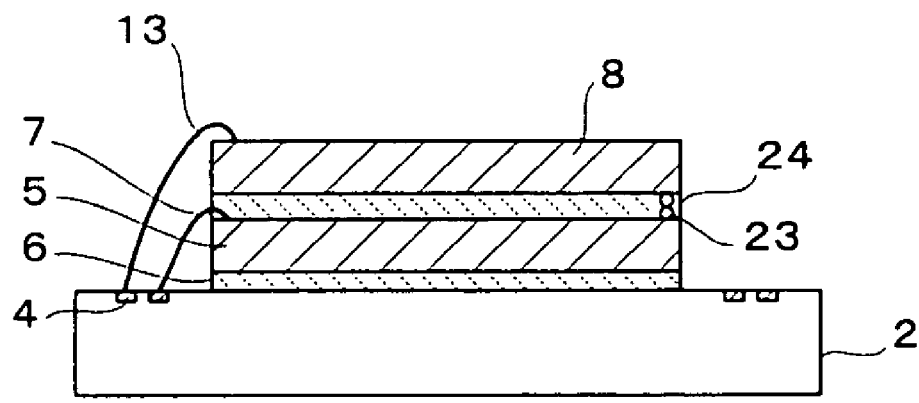
FIG. 8 is a sectional view showing another example of the stacked-type semiconductor device to which the stud bump is applied.

The stud bump 23 is effective for the semiconductor device in which the first semiconductor element and the second semiconductor element are adhered with an adhesive layer of a one-layer structure. FIG. 8 shows a semiconductor device in which a first semiconductor element 5 and a second semiconductor element 8 are adhered with an adhesive layer 24 of the one-layer structure. In such a semiconductor device, the stud bump 23 is formed on the non-connection pad of the first semiconductor element 5. The height of the stud bump 23 is set to be higher than the height of the first bonding wire 7. Consequently, the contact of the first bonding wire 7 with the second semiconductor element 8 can be prevented.

Figure 9:
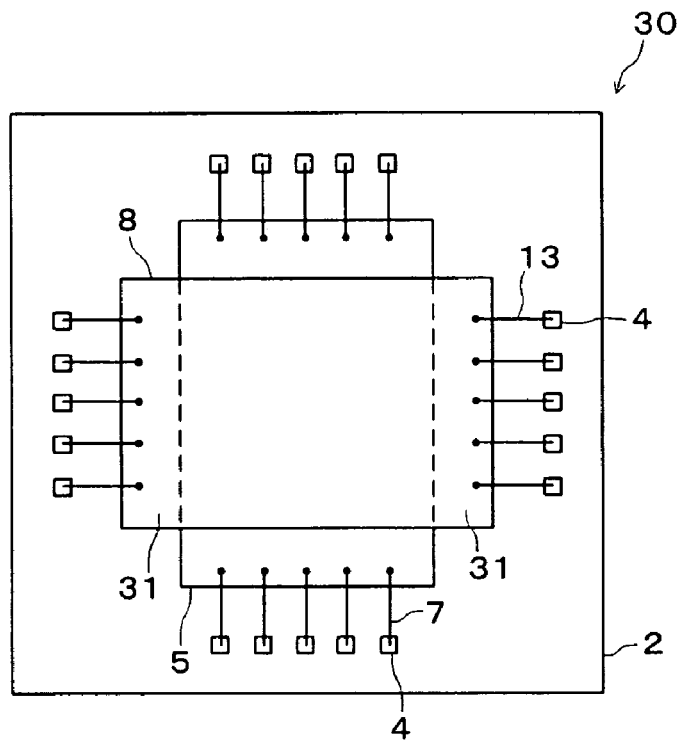
FIG. 9 is a plan view showing a configuration of a second embodiment of a stacked-type semiconductor device applying a stacked-type electronic component according to the present invention.
Figure 10:
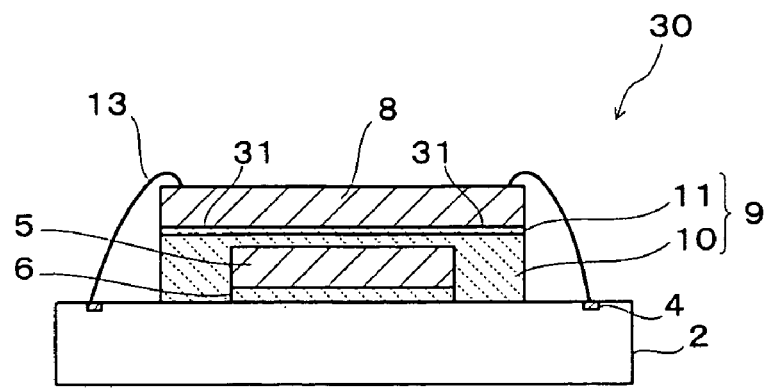
FIG. 10 is a sectional view of the stacked-type semiconductor device shown in FIG. 9.

Next, as for a stacked-type semiconductor device according to a second embodiment of the present invention is described with reference to FIG. 9 and FIG. 10. FIG. 9 is a plan view showing a schematic configuration of the stacked-type semiconductor device according to the second embodiment, and FIG. 10 is a sectional view thereof. Incidentally, the same reference numerals and symbols are used to designate the same and corresponding elements with the above-described first embodiment, and a part of the description thereof will not be given.

In a semiconductor device 30 shown in FIG. 9 and FIG. 10, a first semiconductor element 5 is adhered on a substrate such as a circuit board 2 via a first adhesive layer 6, as same as the above-described first embodiment. Electrode pads of the first semiconductor element 5 are electrically connected to electrode portions 4 of the circuit board 2 via first bonding wires 7. On the first semiconductor element 5, a second semiconductor element 8 is adhered by using an adhesive layer 9 of a two-layer structure having a first layer 10 and a second layer 11. Electrode pads of the second semiconductor element 8 are electrically connected to the electrode portions 4 of the circuit board 2 via second bonding wires 13.

The second semiconductor element 8 is Offset and disposed relative to the first semiconductor element 5. Consequently, both end portions corresponding to wire bonding portions of the second semiconductor element 8 are protruding outside from an outer periphery of the first semiconductor element 5. Below these protruding portions 31, the first semiconductor element 5 does not exist, and therefore, hollow portions appear below the second semiconductor element 8, concretely, below the protruding portions 31, if nothing is done. The wire bonding is performed for the electrode pads of the second semiconductor element 8 having the protruding portions 31, the second semiconductor element 8 is deformed by a loading at the time of the bonding. Herewith, a crack, and so on, occurs in the second semiconductor element 8, a bonding failure, and so on, may occur.

Consequently, in the semiconductor device 30 of this embodiment, the first layer 10 in the adhesive layer 9 of the two-layer structure is filled by softened or melted at a heating temperature (adhesive temperature) used when the second semiconductor element 8 is adhered, into a space between the protruding portions 31 of the second semiconductor element 8 and the circuit board 2. Namely, a part of the first layer 10 softened or melted at the heating temperature is filled below the protruding portions 31 of the second semiconductor element 8, so as not to occur the hollow portions below the protruding portions 31. Herewith, below the protruding portions 31 of the second semiconductor element 8, an adhesive resin composing the first layer 10 is existing, and therefore, the second semiconductor element 8 may not be deformed at the time of the wire bonding, and the occurrences of the crack of the second semiconductor element 8, the bonding failure, and so on, can be prevented.

Figure 11A:
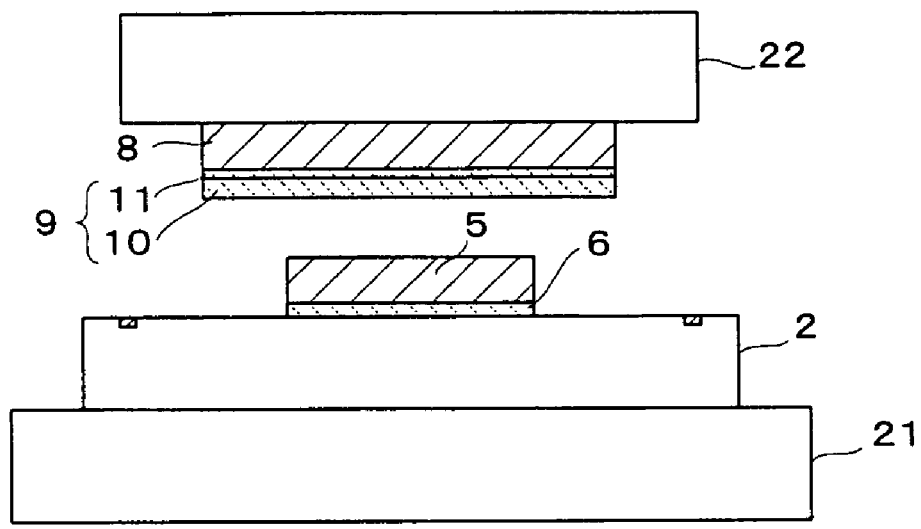
FIG. 11A and FIG. 11B are sectional views showing a manufacturing process of a substantial part of the stacked-type semiconductor device according to the second embodiment of the present invention.

The above-stated semiconductor device 30 of the second embodiment is created, for example, as follows. Incidentally, as for the same portion with the manufacturing process of the semiconductor device 1 according to the first embodiment, a part of the explanation will not be given. At first, as shown in FIG. 11A, the circuit board 2 on which the first semiconductor element 5 is adhesive mounted, is placed on a heating stage 21. Meanwhile, the second semiconductor element 8 to which the adhesive layer 9 of the two-layer structure is bonded at the lower surface side thereof, is held by a mounting tool 22. Incidentally, the adhesive layer 9 of the two-layer structure may be formed by sequentially coating a thermosetting resin varnish at the lower surface of the second semiconductor element 8.

In the adhesive layer 9 of the two-layer structure bonded to the lower surface of the second semiconductor element 8, the thickness of the second layer 11 maintaining the layered shape for the heating temperature, may be the thickness (for example, 5 μm to 15 μm) in which the function as an insulating layer can be obtained, as same as the first embodiment. Meanwhile, it is required to set the thickness of the first layer 10, not only enough for adhering the first semiconductor element 5 and the second semiconductor element 8, but also for supplying the insulating resin capable for fully filling below the protruding portions 31 of the second semiconductor element 8. However, when the amount of the adhesive resin (insulating resin) composing the first layer 10 is too much, the first layer 10 is protruded from the outer peripheral portion of the second semiconductor element 8 to occur an inconvenience.

Figure 12:
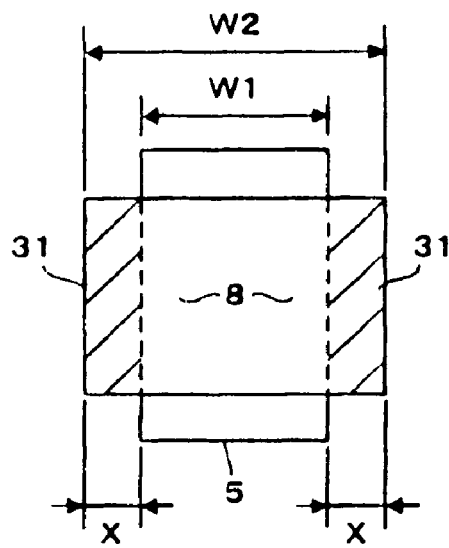
FIG. 12 is a view to explain a size of protruding portions (hollow amount) of a second semiconductor element in the stacked-type semiconductor device shown in FIG. 9.
Figure 13:
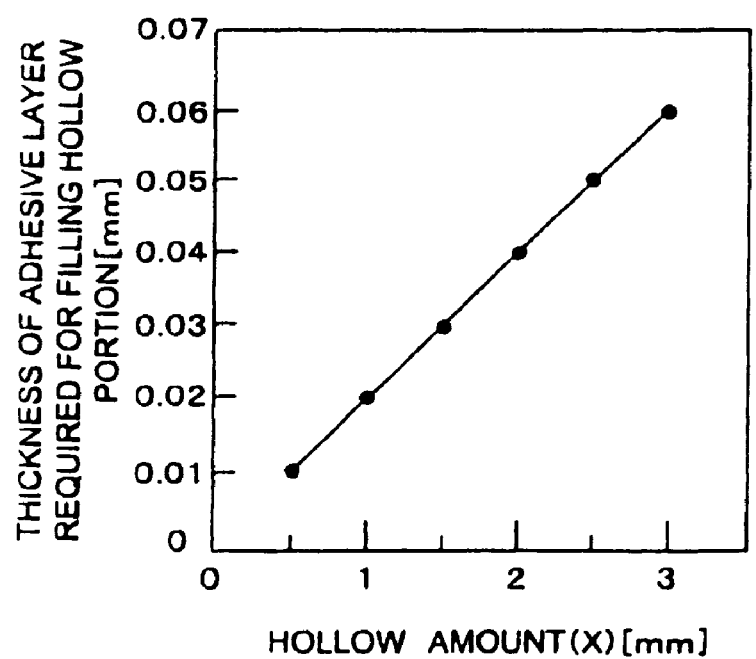
FIG. 13 is a view showing an example of a relation between the size of the protruding portions (hollow amount) of the second semiconductor element and a thickness of an adhesive layer required for filling a hollow portion.

Therefore, the thickness of the first layer 10 in the adhesive layer 9 of the two-layer structure, namely, the adhesive resin layer 10 softened or melted at the heating temperature, is set with considering the required amount for the adhesive of the first semiconductor element 5 and the second semiconductor element 8, and the required amount for filling below the protruding portions 31 (hollow portion) of the second semiconductor element 8. For example, as shown in FIG. 12, when a width W2 of the second semi conductor element 8 is 10 mm (entire shape is 10 mm×10 mm), a width of the protruding portion 31 (hollow amount) is x mm, a width W1 of the first semiconductor element 5 is (10–2x) mm, and a step (height from a surface of a substrate 2 to an upper surface of the first semiconductor element 5) is 0.2 mm, the thickness of the first layer 10 required for filling the hollow portions below the protruding portions 31 with the hollow amount of x mm becomes, for example, as shown in FIG. 13.

Figure 11B:
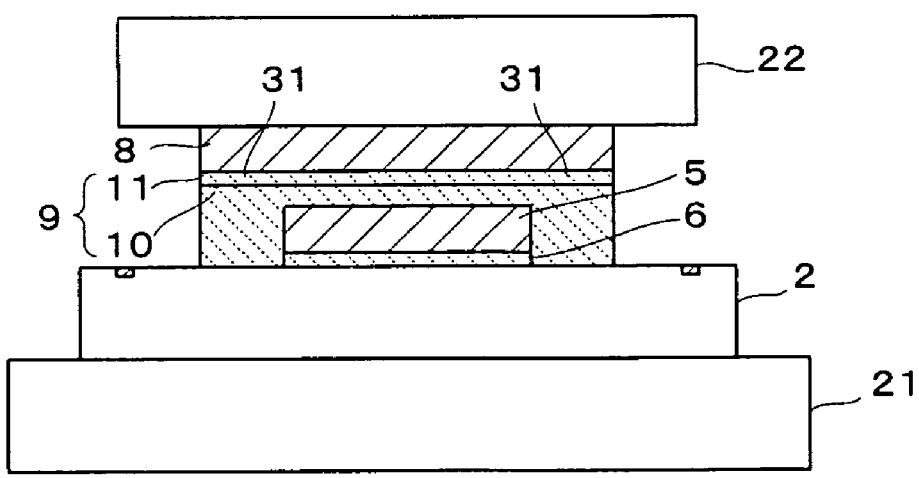

Next, as shown in FIG. 11B, the second semiconductor element 8 held by the mounting tool 22 is positioned relative to the first semiconductor element 5. The mounting tool 22 is lowered, the second adhesive layer 9 is pressed to the first semiconductor element 5 with an appropriate pressure, and the second adhesive layer 9 is heated by using at least either one of the heating stage 21 or the mounting tool 22. The heating temperature at this time is to be the dry temperature of the first layer 10 or more and less than the dry temperature of the second layer 11 as it is the same as the first embodiment. In this pressurizing and heating processes, the thickness of the first layer 10 in the adhesive layer 9 of the two-layer structure is controlled as stated above, and therefore, the hollow portions below the protruding port ions 31 of the second semiconductor element 8 can be well filled with the adhesive resin (insulating resin) composing the first layer 10, without making the first layer 10 protruding from the outer peripheral portion of the second semiconductor element 8.

The second semiconductor element 8 is adhered on the first semiconductor element 5, the hollow portions below the protruding portions 31 of the second semiconductor element 8 is filled with the adhesive resin (insulating resin), and thereafter, the electrode portions 4 of the circuit board 2 and the electrode pads of the second semiconductor element 8 are electrically connected by the second bonding wires 13. At this time, below the protruding portions 31 corresponding to the wire bonding port ions of the second semiconductor element 8, the adhesive resin is filled, and therefore, the deformation of the second semiconductor element 8 at the time of wire bonding can be prevented. Consequently, the occurrences of the crack of the second semiconductor element 8, the bonding failure, and so on, caused by the bonding load can be largely suppressed. Subsequently, as same as the first embodiment, the forming process of the external connection terminals, the sealing process with the sealing resin, and so on, are performed, and thereby, the semiconductor device 30 of the stacked-type multi chip package structure can be obtained.

According to the above-stated semiconductor device 30 of the second embodiment, it becomes possible to adhere the first and second semiconductor elements 5, 8 well with low cost, as same as in the first embodiment, and to largely suppress the crack of the second semiconductor element 8, the bonding failure, and so on, resulting from the offset disposition of the second semiconductor element 8. Incidentally, such a constitution is not limited to the case when the second semiconductor element 8 is offset, but, for example, as shown in FIG. 14 and FIG. 15, it is effective when the second semiconductor element 8 larger than the first semiconductor element 5 is disposed on the first semiconductor element 5.

Figure 14:
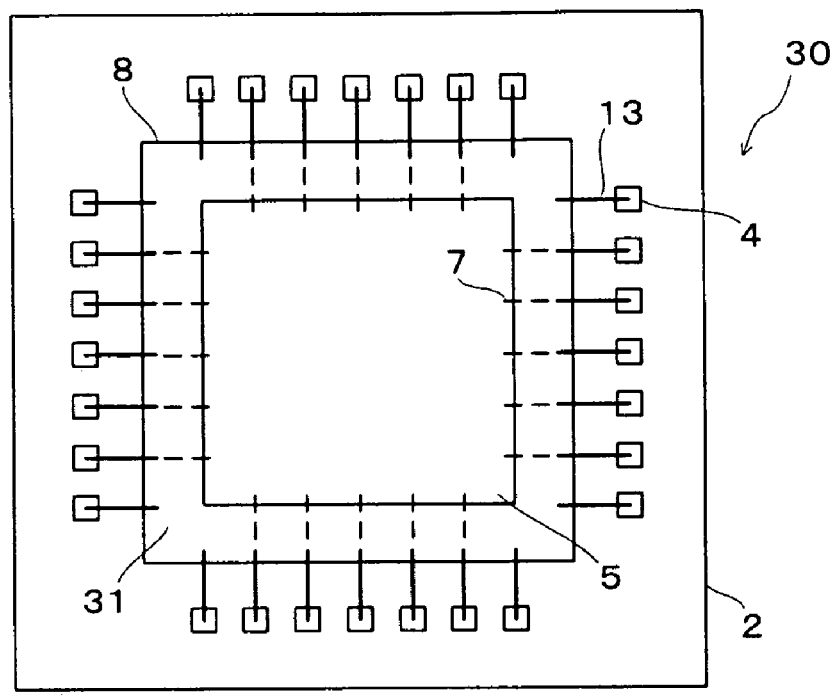
FIG. 14 is a plan view showing a modification example of the stacked-type semiconductor device shown in FIG. 9.
Figure 15:
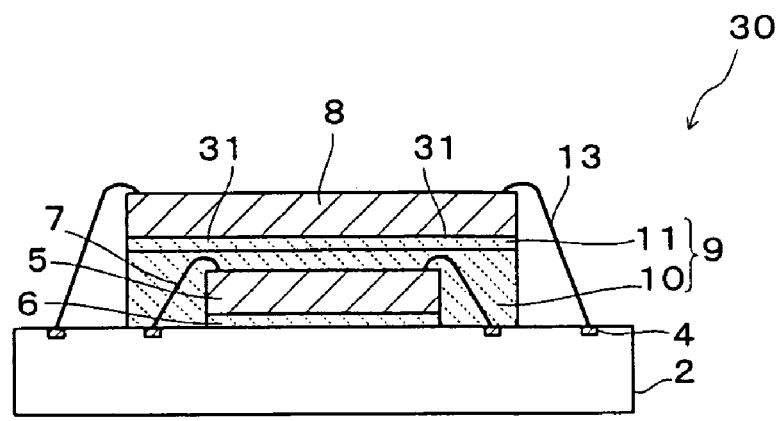
FIG. 15 is a sectional view of the stacked-type semiconductor device shown in FIG. 14.

In the semiconductor device 30 shown in FIG. 14 and FIG. 15, on the first semiconductor element 5, the second semiconductor element 8 larger than that is adhered by using the adhesive layer 9 of the two-layer structure. Consequently, the outer peripheral portions of the second semiconductor element 8 corresponding to the wire bonding portions are protruding outside from the outer periphery of the first semiconductor element 5. The hollow portions below these protruding portions 31 are respectively filled with the first layer 10 in the adhesive layer 9 of the two-layer structure because it is softened or melted at the heating temperature (adhesive temperature) when the second semiconductor element 8 is adhered. Consequently, below the protruding portions 31 of the second semiconductor element 8, there is the adhesive resin composing the first layer 10, and therefore, the second semiconductor element 8 may not be deformed at the time of wire bonding, and the occurrences of the crack of the second semiconductor element 8, the bonding failure, and so on, can be prevented.

Next, a stacked-type semiconductor device according to a third embodiment of the present invention is described with reference to FIG. 16, FIG. 17, and FIG. 18. Incidentally, the same reference numerals and symbols are used to designate the same and corresponding elements with the above-described first and second embodiments, and a part of the description thereof will not be given. In a semiconductor device 40 shown in FIG. 16, a semiconductor element 41 as a first electronic component, and a package component 42 as a second electronic component, are stacked, and a stacked-type package structure is constituted from these. The electronic components constituting the stacked-type electronic component is not limited to a single semiconductor element (bear chip), but it may be a semiconductor component in which the semiconductor element is packaged in advance. Further, it is not limited to the semiconductor components such as the semiconductor element 41 or the package component 42, but it may be the electronic components such as general circuit components.

Figure 16:
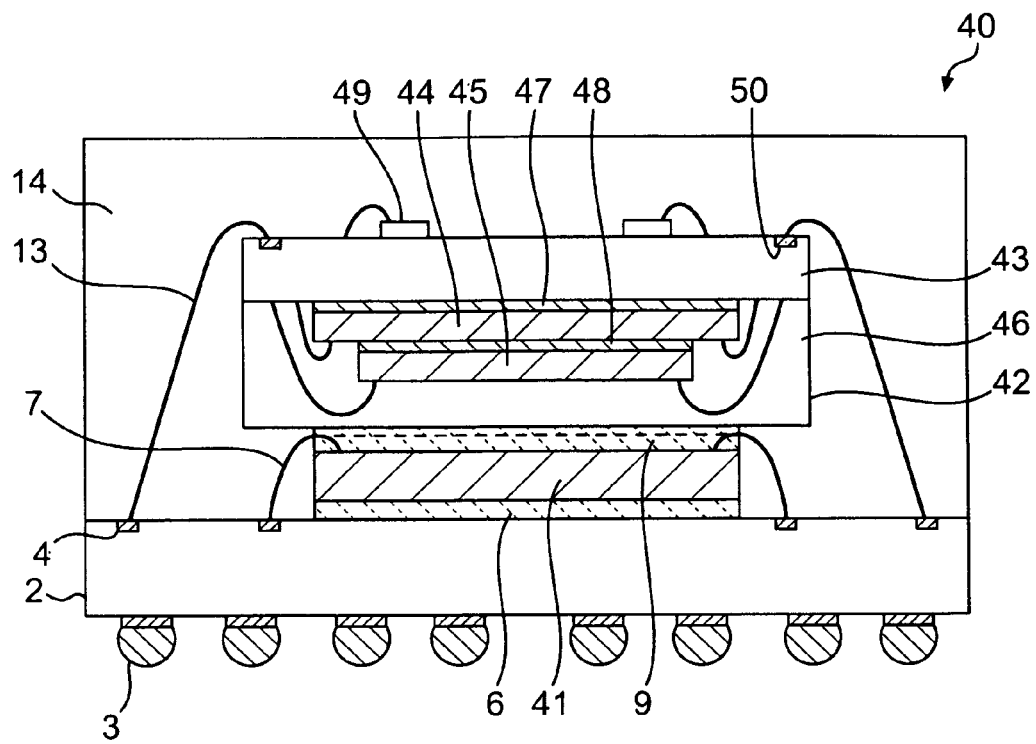
FIG. 16 is a sectional view schematically showing a configuration of a third embodiment of a stacked-type semiconductor device applying a stacked-type electronic component according to the present invention.

As it is the same as the above-stated embodiments, in the semiconductor device 40 shown in FIG. 16, the semiconductor element 41 as the first electronic component is adhered on a circuit board 2 via a first adhesive layer 6. Electrode pads of the semiconductor element 41 are electrically connected to electrode portions 4 of the circuit board 2 via first bonding wires 7. On the semiconductor element 41, the package component 42 as the second electronic component is adhered by using a second adhesive layer 9 of a two-layer structure. The constitution of the second adhesive layer 9 is as stated above.

The package component 42 has a structure in which a first semiconductor element 44 and a second semiconductor element 45 are sequentially stacked on a circuit board 43, and it is packaged with a sealing resin 46 in advance. The first semiconductor element 44 is adhered on the circuit board 43 via an adhesive layer 47, and similarly, the second semiconductor element 45 is adhered on the first semiconductor element 44 via an adhesive layer 48. Incidentally, a numeral 49 denotes a passive component. Such a package component 42 is stacked on the semiconductor element 41 so that the circuit board 43 faces above. Further, electrode pads 50 provided at a rear surface side of the circuit board 43 are electrically connected to the electrode portions 4 of the circuit board 2 via the second bonding wires 13.

The semiconductor element 41 and the package component 42 stacked and disposed on the circuit board 2 are sealed by using a sealing resin 14, for example, such as an epoxy resin, and thereby, the semiconductor device 40 having the stacked-type package structure is constituted. Also in this a semiconductor device 40, it is possible to prevent the deformation of the first bonding wire 7, the connection failure, and so on, and in addition, to adhere the package component 42 on the semiconductor element 41 well with low coast. Moreover, the adhesive layer 9 of the two-layer structure is formed by the same material, and therefore, the peeling between the components, and so on, may not occur after the adhesive process of the package component 42, and further, it is possible to suppress the increase of the number of manufacturing processes or the manufacturing cost required for the adhesion.

Figure 17:
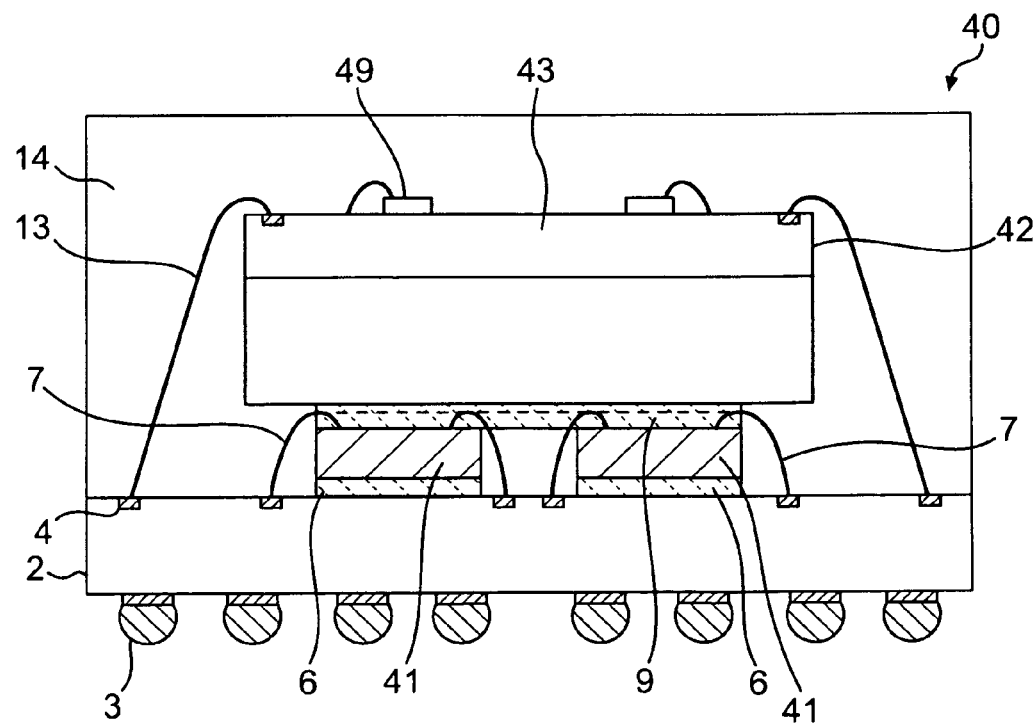
FIG. 17 is a sectional view showing a modification example of the stacked-type semiconductor device shown in FIG. 16.
Figure 18:
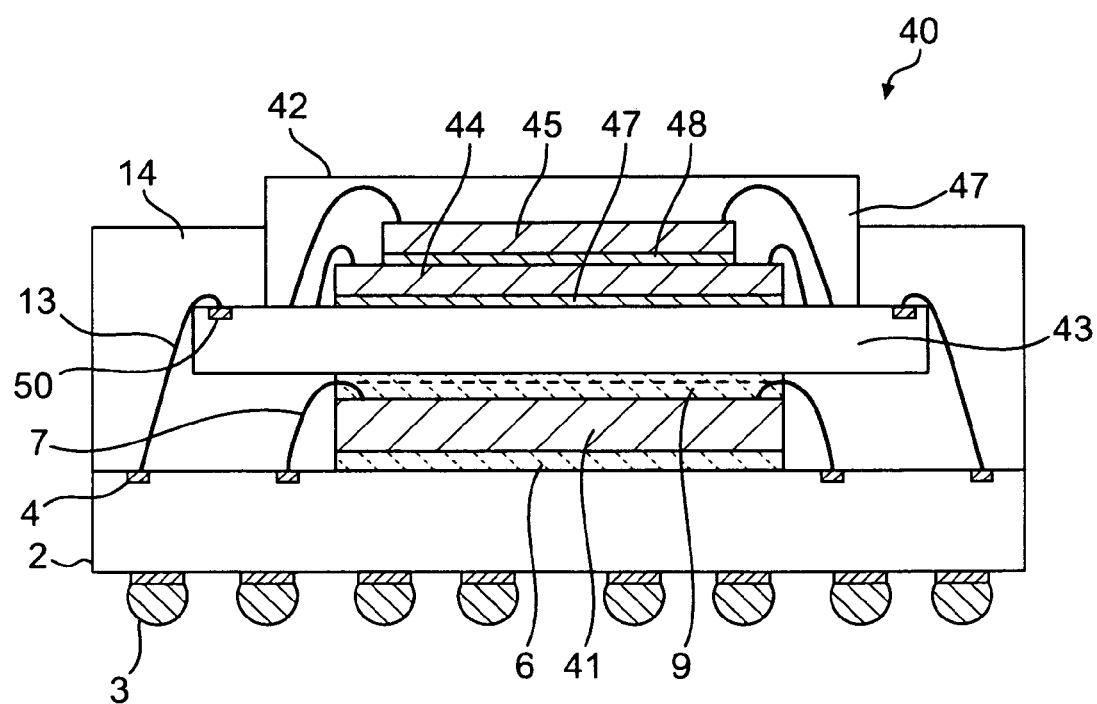
FIG. 18 is a sectional view showing another modification example of the stacked-type semiconductor device shown in FIG. 16.

The stacked structure of the semiconductor element 41 and the package component 42 may be formed, for example, as shown in FIG. 17, by stacking the package component 42 on the two semiconductor elements 41, 41 disposed on the circuit board 2. Such stacked structure is effective when the size of the semiconductor element 41 is largely different from that of the package component 42. Besides, the package component 42 can be stacked so that the circuit board 43 faces below, as shown in FIG. 18. In this case, the second bonding wires 13 are connected to the electrode pads 50 provided at an upper surface side of the circuit board 43. Incidentally, in the third embodiment, various modifications can be made as it is the same as in the first and second embodiments.

Figure 19:
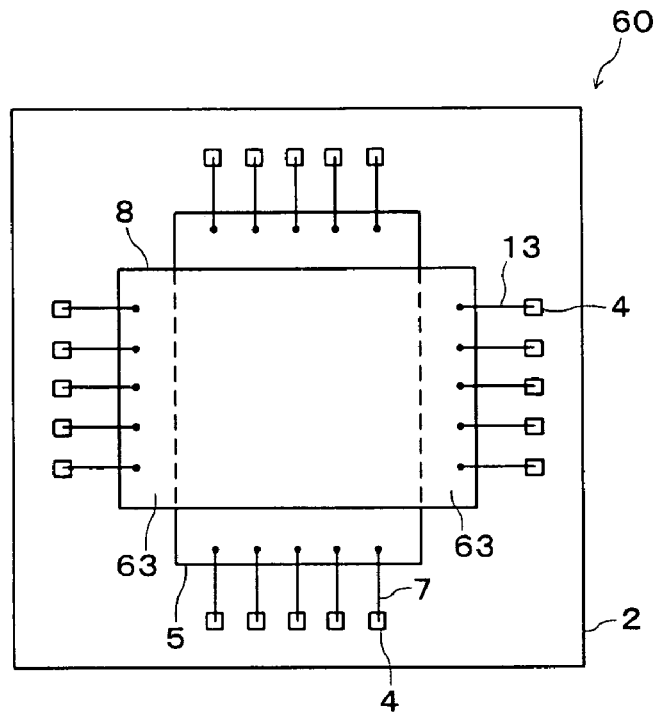
FIG. 19 is a plan view showing a configuration of a fourth embodiment of a stacked-type semiconductor device applying a stacked-type electronic component according to the present invention.
Figure 20:
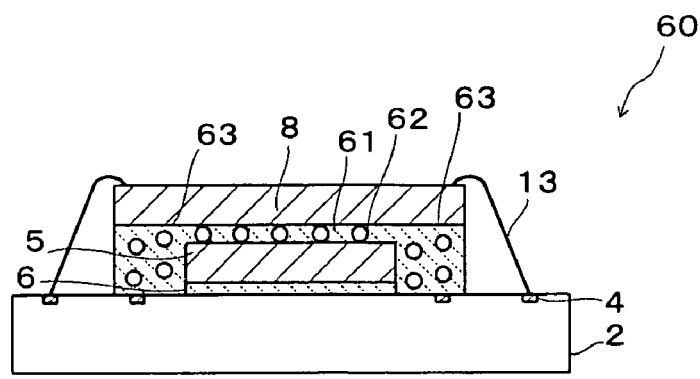
FIG. 20 is a sectional view of the stacked-type semiconductor device shown in FIG. 19.

Next, a stacked-type semiconductor device according to a fourth embodiment of the present invention is described with reference to FIG. 19 and FIG. 20. FIG. 19 is a plan view showing a schematic configuration of a semiconductor device according to the fourth embodiment, and FIG. 20 is a sectional view thereof. Incidentally, the same reference numerals and symbols are used to designate the same and corresponding elements with the above-described first, second and third embodiments, and a part of the description thereof will not be given.

In a semiconductor device 60 shown in FIG. 19 and FIG. 20, a first semiconductor element 5 is adhered on a circuit board 2 via a first adhesive layer 6 as same as the above-stated first and second embodiments. Electrode pads of the first semiconductor element 5 are electrically connected to electrode portions 4 of the circuit board 2 via first bonding wires 7. On the first semiconductor element 5, a second semiconductor element 8 is adhered via a second adhesive layer 61. Electrode pads of the second semiconductor element 8 are electrically connected to the electrode portions 4 of the circuit board 2 via second bonding wires 13.

The second adhesive layer 61 adhering the second semiconductor element 8 on the first semiconductor element 5, contains an insulating filler 62 maintaining a solid state for an adhesive temperature (heating temperature), and this insulating filler 62 functions as a spacer keeping a distance between the first and second semiconductor elements 5, 8. Consequently, it becomes possible to adhere the second semiconductor element 8 on the first semiconductor element 5 well and with low cost, while preventing the deformation of the first bonding wire 7, the connection failure, and further, the contact of the first bonding wire 7 with the second semiconductor element 8, and so on.

The insulating filler 62 disposed within the second adhesive layer 61 is, composed of an insulating resin having a heat resistance and an intensity capable for maintaining a shape (shape maintaining ability) for a temperature (heating temperature) when, for example, the second semiconductor element 8 is adhered, and the concrete material thereof is not particularly limited. As concrete composing materials of the insulating filler 62, thermosetting resins such as an urethane resin, a polyimide resin, a silicon resin, and an acrylic resin can be cited. By using an adhesive resin (epoxy resin, and so on) containing the insulating filler 62 composed of such insulating resin, the second semiconductor element 8 is adhered on the first semiconductor element 5.

Further, the second semiconductor element 8 is offset and disposed relative to the first semiconductor element 5. Consequently, both end portions of the second semiconductor element 8 corresponding to wire bonding portions are protruding outside from an outer periphery of the first semiconductor element 5. Below these protruding portions 63, the second adhesive layer 61 is filled by softened or melted at a heating temperature (adhesive temperature) when the second semiconductor element 8 is adhered. Namely, a part of the second adhesive layer 61 softened or melted at the heating temperature is filled below the protruding portions 63 of the second semiconductor element 8, so that hollow portions below the protruding portions 63 do not appear. A thickness of the second adhesive layer 61 is preferable to be set accordingly in consideration with a filling amount of the hollow portions, as same as the second embodiment.

According to the above-stated semiconductor device 60 of the fourth embodiment, as it is the same as in the first and second embodiments, it is possible to largely suppress a crack of the second semiconductor element 8, a bonding failure, and so on, resulting from the offset disposition of the second semiconductor element 8, while enabling the adhesion between the first and second semiconductor elements 5, 8 well with low cost. This structure effectively functions in case when a larger second semiconductor element is disposed on a first semiconductor element as it is the same as is the second embodiment.

Figure 21:
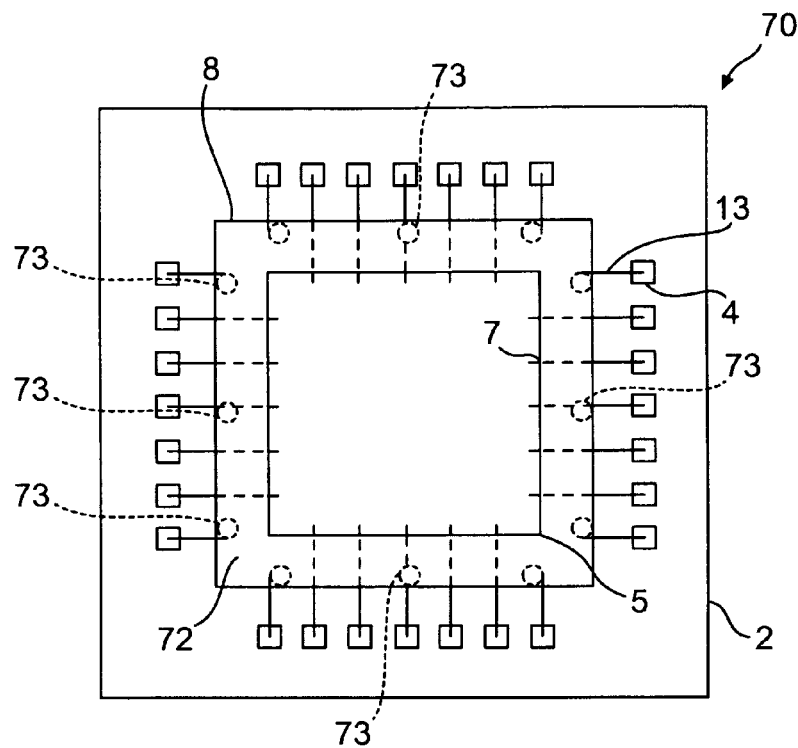
FIG. 21 is a plan view showing a configuration of a fifth embodiment of a stacked-type semiconductor device applying a stacked-type electronic component according to the present invention.
Figure 22:
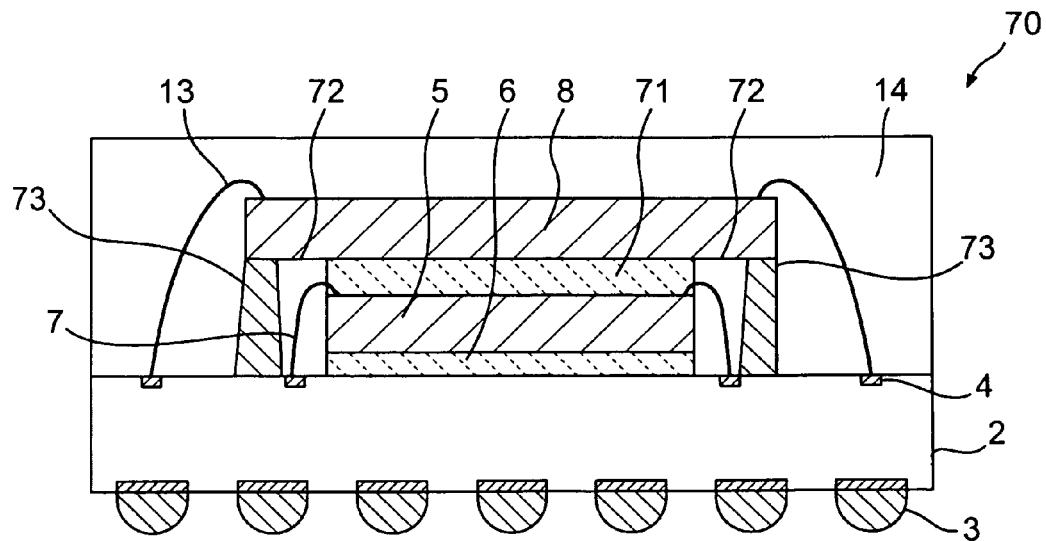
FIG. 22 is a sectional view of the stacked-type semiconductor device shown in FIG. 21.

Next, a stacked-type semiconductor device according to a fifth embodiment of the present invention is described with reference to FIG. 21 and FIG. 22. FIG. 21 is a plan view showing a schematic configuration of a semiconductor device according to the fifth embodiment, and FIG. 22 is a sectional view thereof. Incidentally, the same reference numerals and symbols are used to designate the same and corresponding elements with the above-described respective embodiments, and a part of the description thereof will not be given.

As same as the above-stated respective embodiments, in a semiconductor device 70 shown in FIG. 21 and FIG. 22, a first semiconductor element 5 is adhered on a substrate such as a circuit board 2 via a first adhesive layer 6. Electrode pads of the first semiconductor element 5 are electrically connected to electrode portions 4 of the circuit board 2 via first bonding wires 7. On the first semiconductor element 5, a second semiconductor element 8 larger than that is adhered via a second adhesive layer 71. For the first and second adhesive layers 6, 71, general die attach materials (die attach film, and so on) are used.

The second semiconductor element 8 has a larger shape than the first semiconductor element 5, and therefore, outer peripheral portions of the second semiconductor element 8 corresponding to wire bonding portions are protruding outside from an outer periphery of the first semiconductor element 5. Below protruding portions 72 corresponding to the outer peripheral portions of the second semiconductor element 8, the first semiconductor element 5 does not exist, and therefore, the protruding portions 72 of the second semiconductor element 8 become to be states throwing out in hollow, if nothing is done. When a wire bonding is performed for the electrode pads of the second semiconductor element 8 having such protruding portions 72, the second semiconductor element 8 is deformed by a loading at the bonding time, and thereby, a crack, and so on, of the second semiconductor element 8, may occur, and a bonding failure, and so on, may also occur.

Therefore, in the semiconductor device 70 of this embodiment, insulating columnar bodies 73 are provided in advance below the protruding portions 72 of the second semiconductor element 8. Namely, the protruding portions 72 of the second semiconductor element 8 are supported by the insulating columnar bodies 73 provided at predetermined positions of the circuit board 2. In the semiconductor device 70 of this embodiment, the respective protruding portions 72 are supported by a plural number of, for example, three insulating columnar bodies 73 disposed per one side of the second semiconductor element 8. The number of the insulating columnar bodies 73 disposed per the respective sides of the second semiconductor element 8 may be one, but it is preferable to dispose the plural number of insulating columnar bodies 73 per the respective sides of the second semiconductor element 8 so as to enhance a stiffness and to disperse a loading at a stacking time or at a connection time.

The insulating columnar body 73 supporting the protruding portion 72 is composed of an insulating material such as an insulating resin at least at an abutting portion with the second semiconductor element 8. The insulating columnar bodies 73 in the semiconductor device 70 shown in FIG. 21 and FIG. 22 are formed by coating a thermosetting insulating resin, for example, such as an epoxy resin, a polyimide resin, a silicon resin, and an acrylic resin, or a light curing insulating resin such as a UV cure insulating resin on the columns and curing them. As the light curing insulating resin, for example, a UV cure acrylic resin composition can be cited. The UV cure acrylic resin composition contains a prepolymer or monomer having an acryloyl group as a reaction group and a photopolymerization initiator, and it cures by irradiating an ultraviolet ray. In such a UV cure insulating resin composition, only a portion irradiated by the ultraviolet ray cures, and therefore, it is easy to stable the shape after coating.

Figure 23:
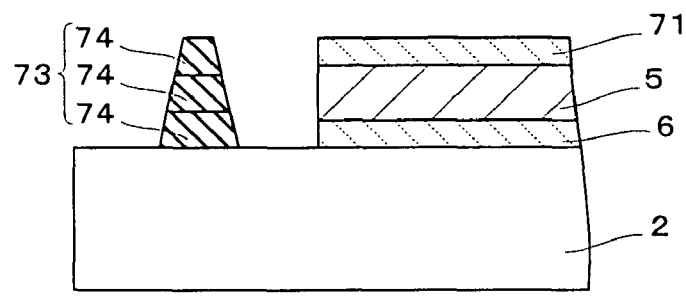
FIG. 23 is a sectional view showing another configuration example of an insulating columnar body used for the stacked-type semiconductor device shown in FIG. 21.

Depending on the height of the insulating columnar body 73, for example, as shown in FIG. 23, a plurality of resin columns 74, 74 are stacked to form it. Herewith, a dispersion in height of the insulating columnar bodies 73, and so on, can be eliminated. The number of resin columns 74 to be stacked is appropriately set in accordance with the height of the insulating columnar body 73 and a viscosity of the resin composition being a forming material of the resin columns 74, and so on. FIG. 23 shows a state that the three resin columns 74 are stacked to form the insulating columnar body 73.

Figure 24:
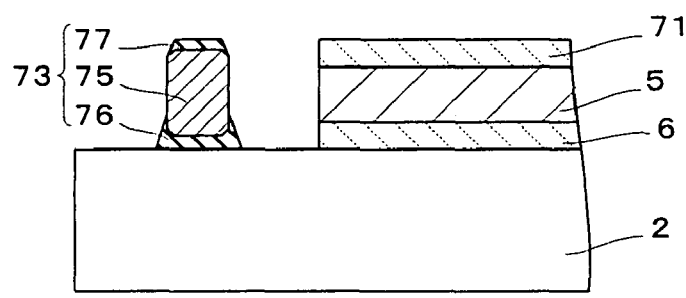
FIG. 24 is a sectional view showing still another configuration example of the insulating columnar body used for the stacked-type semiconductor device shown in FIG. 21.

Besides, to improve a moldability, intensity, and so on, of the insulating columnar body 73, for example, as shown in FIG. 24, a reinforcing material 75 can be disposed inside of the insulating columnar body 73. For the reinforcing material 75, for example, an insulating resin molded body, an insulating inorganic material (glass, ceramics, and so on), a metallic member, and so on, are used. The insulating columnar body 73 including such reinforcing material 75, is created by at first forming a lower resin layer 76 on the circuit board 2, disposing the reinforcing material 75 above that, and thereafter, forming an upper resin layer 77 to be an abutting portion with the second semiconductor element 8. The reinforcing material 75 is disposed inside of the insulating columnar body 73, and thereby, the dispersion in the height of the insulating columnar bodies 73, and so on, can be eliminated, and the wire bonding becomes further more easy because the intensity and a hardness are improved.

Figure 25:
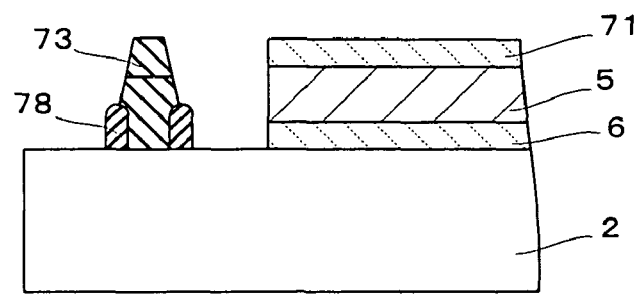
FIG. 25 is a sectional view showing yet another configuration example of the insulating columnar body used for the stacked-type semiconductor device shown in FIG. 21.

Further, as shown in FIG. 25, a dam frame 78 may be provided in advance by using a resin composition with high viscosity, and the insulating columnar body 73 is formed inside of it. The dam frame 78 is provided at an outer periphery of the insulating columnar body 73, and therefore, it is possible to form a relatively high insulating columnar body 73 well, and a destruction, and so on, of the insulating columnar body 73 at the stacking time or the connection time can be suppressed. Further, a spread of the resin material in a plane direction when the insulating columnar body 73 is formed can be suppressed, and therefore, it becomes possible to prevent an attachment of resin, and so on, to the electrode portions 4 existing on the circuit board 2.

In the second semiconductor element 8 mounted on the first semiconductor element 5, the second bonding wires 13 are connected to the second electrode pads provided at an upper surface side thereof, and further, it is electrically connected to the electrode portions 4 of the circuit board 2 via the second bonding wires 13. When the wire bonding is performed to the second semiconductor element 8, the protruding portions 72 of the second semiconductor element 8 are supported by the insulating columnar bodies 73 provided on the circuit board 2, and therefore, it is possible to suppress the deformation of the second semiconductor element 8 by a loading at the time of the wire bonding. Herewith, the occurrences of the crack, the bonding failure (connection failure), and so on, caused by the deformation of the second semiconductor element 8 can be effectively suppressed. Further, the deformation of the first bonding wire 7, the connection failure, and so on, resulting from the deformation of the second semiconductor element 8 can be prevented.

The first and second semiconductor elements 5, 8 stacked and disposed on the circuit board 2 are sealed by using a sealing resin 14, for example, such as an epoxy resin, and thereby, the semiconductor device 70 with the stacked-type multi chip package structure is constituted. Incidentally, in FIG. 21, and FIG. 22, a structure in which the two semiconductor elements 5, 8 are stacked, is described, but the number of stacks of the semiconductor elements is not limited to this, and it goes without saying that it may be three or more. When three or more semiconductor elements are stacked to constitute a semiconductor device, the protruding portions of the semiconductor elements of the second step or higher are supported by the insulating columnar bodies respectively, and thereby, the occurrences of the element crack, the bonding failure, and so on, can be effectively prevented.

Further, when the first and second semiconductor elements 5, 8 are disposed on the circuit board 2, a spacer can be disposed between these semiconductor elements 5, 8. In this structure, the spacer generally has a smaller shape than the semiconductor elements 5, 8. Consequently, when the first and second semiconductor elements 5, 8 have the same shape, the second semiconductor element 8 may have the protruding portions for the spacer. In such a stacked structure, the second semiconductor element 8 is supported by the insulating columnar bodies 73 disposed on the first semiconductor element 5. Herewith, the bonding property for the second semiconductor element 8 can be enhanced.

Figure 26A:
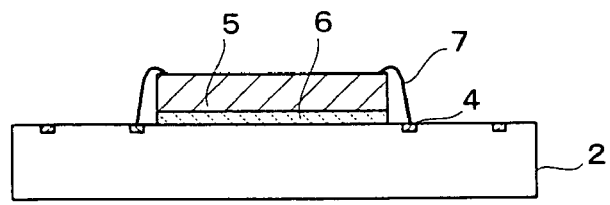
FIG. 26A, FIG. 26B, FIG. 26C, and FIG. 26D are sectional views showing a manufacturing process of a substantial part of a stacked-type semiconductor device according to the fifth embodiment of the present invention.

The above-stated semiconductor device 70 of the fifth embodiment is created, for example, as described below. The manufacturing process of the semiconductor device 70 is described with reference to FIG. 26A to FIG. 26D. At first, as shown in FIG. 26A, the first semiconductor element 5 is adhered on the circuit board 2 by using the first adhesive layer 6. Subsequently, the wire bonding process is performed, and the electrode portions 4 of the circuit board 2 and the electrode pads of the first semiconductor element 5 are electrically connected by the first bonding wires 7.

Figure 26B:
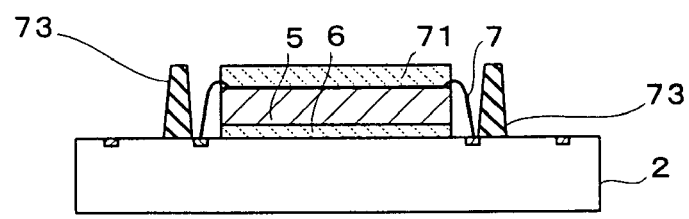

Next, as shown in FIG. 26B, the insulating columnar bodies 73 are formed at predetermined positions of the circuit board 2 to which the first semiconductor element 5 is adhesive mounted. The insulating column body 73 is formed by coating the thermosetting insulating resin such as the epoxy resin, the light curing insulating resin, and so on, in column state as stated above. The insulating columnar body 73 can be formed by stacking the plurality of resin columns as shown in FIG. 23. Besides, the insulating columnar bodies 73 having structures shown in FIG. 24 and FIG. 25 can be applied. Even when any structure is adopted, it is preferable that at least the abutting portion with the second semiconductor element 8 is formed with the insulating resin. Further, the die attach material, and so on, to be the second adhesive layer 71, is mounted on the first semiconductor element 5.

Figure 26C:
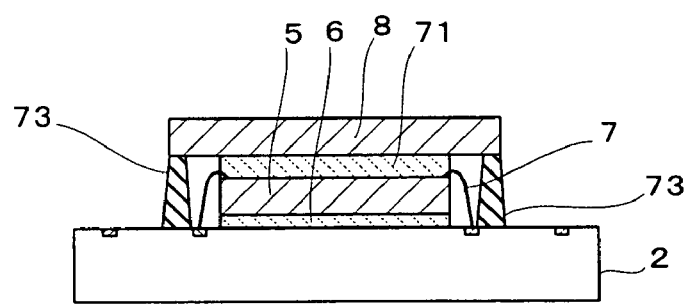

Next, as shown in FIG. 26C, the second semiconductor element 8 is positioning disposed on the first semiconductor element 5. While pressing the second semiconductor element 8 to the first semiconductor element 5 with an appropriate pressing force, the second adhesive layer 71 is heated, and the second semiconductor element 8 is adhered to the first semiconductor element 5. At this time, the protruding portions 72 of the second semiconductor element 8 are pressed to the insulating columnar bodies 73, and the protruding portions 72 and the insulating columnar bodies 73 are adhered. As stated above, the protruding portions 72 of the second semiconductor element 8 are supported by the insulating columnar bodies 73.

Figure 26D:
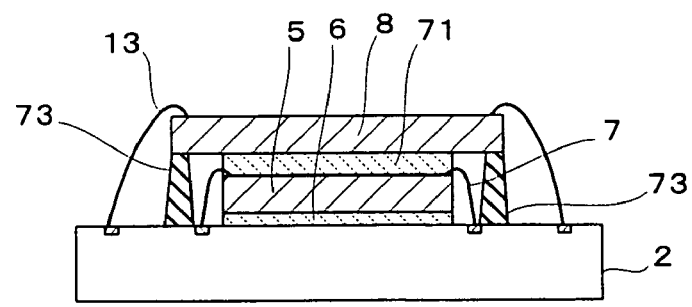

After that, as shown in FIG. 26D, the wire bonding process is performed to the second semiconductor element 8, and the electrode portions 4 of the circuit board 2 and the electrode pads of the second semiconductor element 8 are electrically connected by the second bonding wires 13. At this time, the protruding portions 72 of the second semiconductor element 8 are supported by the insulating columnar bodies 73. Consequently, the deformation of the second semiconductor element 8 by a loading at the wire bonding time is suppressed, and it is possible to effectively suppress the crack of the second semiconductor element 8, the bonding failure, the deformation of the first bonding wire 7, the connection failure, and so on. The forming process of the external connection terminals 3, the resin sealing process with the sealing resin 14, and so on, are performed, and thereby, the semiconductor device 70 with the stacked-type multi chip package structure can be obtained.

As stated above, the protruding portions 72 of the second semiconductor element 8 are supported by the insulating columnar bodies 73, and thereby, the element crack, the connection failure of the bonding wire, and so on, resulting from the protruding portions 72 can be effectively suppressed. Besides, a range of choice of the loading, an ultrasonic output being a connection condition is extended, and therefore, the wire bonding for the second semiconductor element 8 can be performed further well. Further, the insulating columnar bodies 73 do not disturb to make the semiconductor device 70 thin, small, and so on. Therefore, it is possible to realize the semiconductor device 70 with the stacked-type multi chip package structure which is small, thin, and having good reliability, when the semiconductor element 8 is stacked at the upper step side larger than the semiconductor element 5 at the lower step side.

Figure 27:
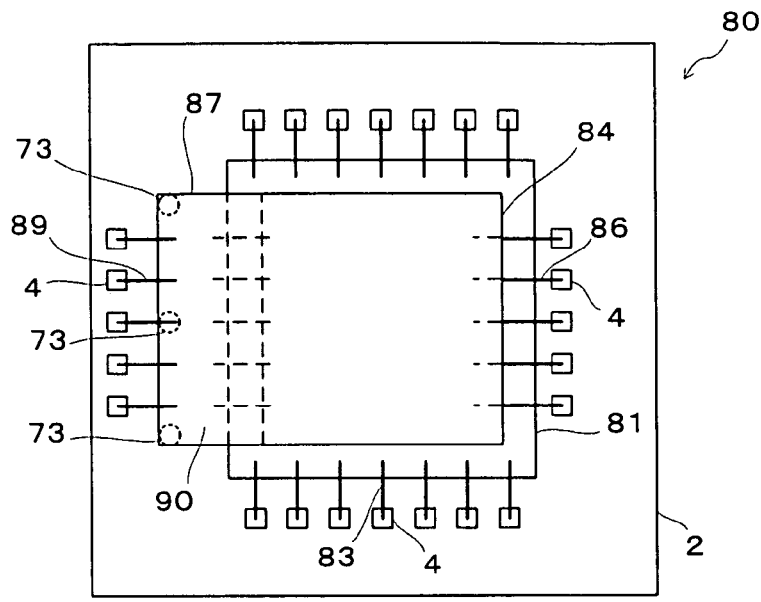
FIG. 27 is a plan view showing a configuration of a sixth embodiment of a stacked-type semiconductor device applying a stacked-type electronic component according to the present invention.
Figure 28:
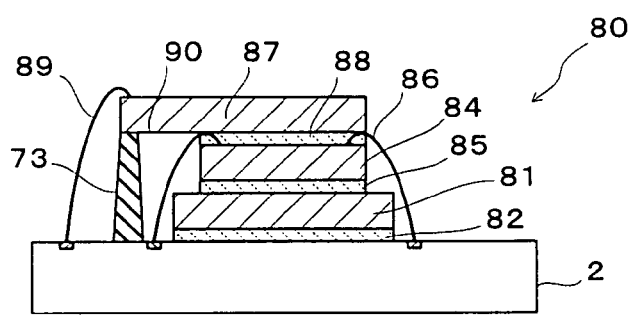
FIG. 28 is a sectional view of the stacked-type semiconductor device shown in FIG. 27 seen from a front direction.
Figure 29:
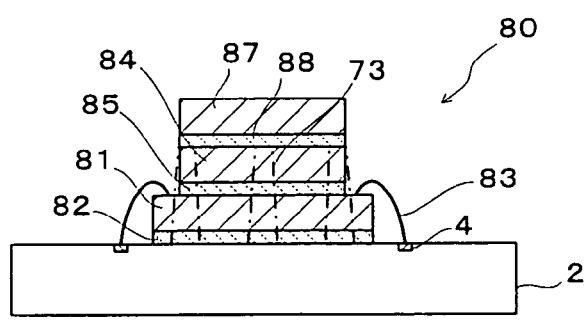
FIG. 29 is a sectional view of the stacked-type semiconductor device shown in FIG. 27 seen from a side direction.

Next, a stacked-type semiconductor device according to a sixth embodiment of the present invention is described with reference to FIG. 27, FIG. 28, and FIG. 29. FIG. 27 is a plan view showing a schematic configuration of a semiconductor device according to the sixth embodiment, FIG. 28 is a sectional view seen from a front direction, and FIG. 29 is a sectional view seen from a side direction. Incidentally, the same reference numerals and symbols are used to designate the same and corresponding elements with the above-described respective embodiments, and apart of the description thereof will not be given.

In a semiconductor device 80 shown in FIG. 27, FIG. 28, and FIG. 29, as it is the same as the above-stated first embodiment, a first semiconductor element 81 is adhered on a circuit board 2 via a first adhesive layer 82. Electrode pads of the first semiconductor element 81 are electrically connected to electrode portions 4 of the circuit board 2 via first bonding wires 83. On the first semiconductor element 81, a second semiconductor element 84 smaller than that is adhered via a second adhesive layer 85. Electrode pads of the second semiconductor element 84 are electrically connected to the electrode portions 4 of the circuit board 2 via second bonding wires 86.

On the second semiconductor element 84, a third semiconductor element 87 is adhered via a third adhesive layer 88. Electrode pads of the third semiconductor element 87 are electrically connected to the electrode portions 4 of the circuit board 2 via third bonding wires 89. For the first, second, and third adhesive layers 82, 85, 88, normal die attach materials are used as same as the above-stated embodiments. Here, the third semiconductor element 87 is offset and disposed relative to the second semiconductor element 84. Consequently, an end portion of the third semiconductor element 87 corresponding to a wire bonding portion is protruding outside from an outer periphery of the second semiconductor element 84.

A protruding portion 90 of the third semiconductor element 87 is supported by the insulating columnar bodies 73 provided on the circuit board 2, as same as the above-stated first embodiment. In this embodiment, the protruding portion 90 is supported by three insulating columnar bodies 73. For the insulating columnar bodies 73, various modes such as the one formed by coating the thermosetting insulating resin such as the epoxy resin, and the light curing insulating resin in column state, the one formed by stacking a plurality of resin columns, further, the one having structures shown in FIG. 24, FIG. 25, are applicable, as same as the above-stated embodiments. Incidentally, the first, second, and third semiconductor elements 81, 84, 87 stacked and disposed on the circuit board 2 are sealed with the sealing resin such as the epoxy resin, though it is not shown, and thereby, the semiconductor device 80 with the stacked-type multi chip package structure is constituted.

In the semiconductor device 80 shown in FIG. 27, FIG. 28, and FIG. 29, the third semiconductor element 87 is protruding not only for the second semiconductor element 84, but also for the first semiconductor element 81. Therefore, the third semiconductor element 87 is supported by the insulating columnar bodies 73 provided on the circuit board 2. When the third semiconductor element 87 is protruding only for the second semiconductor element 84, the insulating columnar bodies 73 may be set on the first semiconductor element 81. By using such insulating columnar bodies 73, the end portion of the third semiconductor element 87 can be supported.

In the above-stated semiconductor device 80 of the sixth embodiment, the protruding portion 90 of the third semiconductor element 87 disposed on the second semiconductor element 84, namely the third semiconductor element 87 which is offset relative to the second semiconductor element 84 is supported by the insulating columnar bodies 73. Herewith, an element crack, a connection failure of the bonding wire, and so on, resulting from the protruding portion 90 can be effectively suppressed. Consequently, when the semiconductor element 87 is offset and stacked at the upper step side relative to the semiconductor element 84 at the lower step side, it becomes possible to realize the semiconductor device 80 with the stacked-type multi chip package structure which is small, thin, and having a good reliability.

In the semiconductor device 80 shown in FIG. 27, FIG. 28, and FIG. 29, a structure in which the third semiconductor element 87 is mounted on the first semiconductor element 81 via the second semiconductor element 84 is shown, but a similar structure can be applied when a spacer chip is disposed instead of the second semiconductor element 84. Besides, not only for the case that the semiconductor elements (including spacer chip) are stacked into three steps, but also for the case that the semiconductor elements are stacked into two steps or in four steps or more, the protruding portions of the semiconductor elements at the second step or higher are supported by the insulating columnar bodies, and thereby, the occurrences of the element crack, the bonding failure, and so on, can be effectively prevented.

Figure 30:
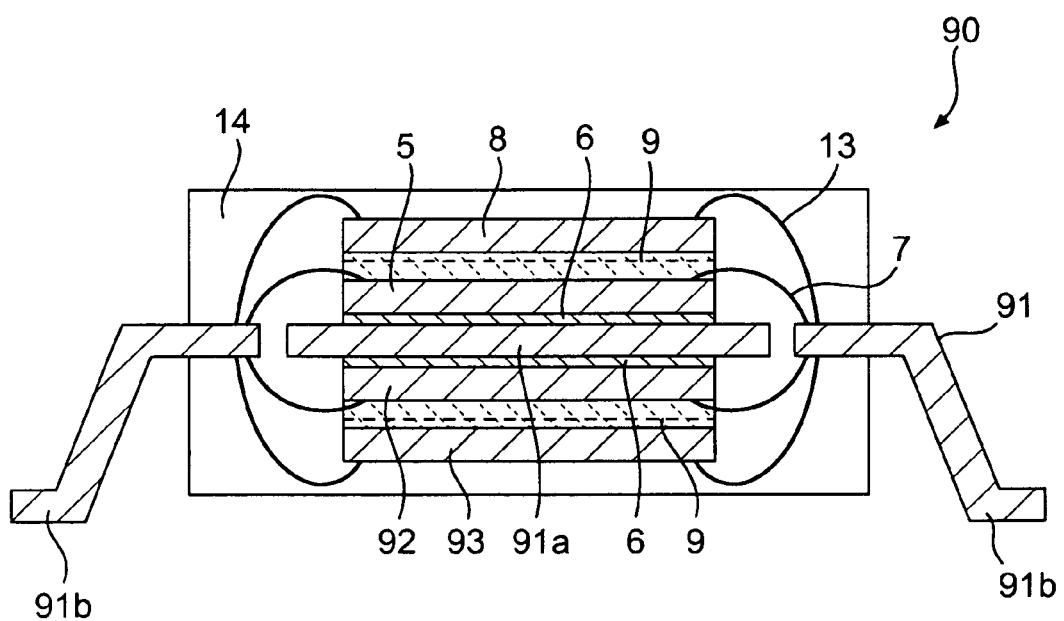
FIG. 30 is a sectional view showing a configuration of a seventh embodiment of a stacked-type semiconductor device applying a stacked-type electronic component according to the present invention.

Next, a stacked-type semiconductor device according to a seventh embodiment of the present invention is described with reference to FIG. 30. FIG. 30 is a sectional view showing a schematic configuration of the stacked-type semiconductor device according to the seventh embodiment. Incidentally, the same reference numerals and symbols are used to designate the same and corresponding elements with the above-described first embodiment, and a part of the description thereof will not be given. A semiconductor device 90 shown in FIG. 30 has a lead frame 91 as a substrate for mounting elements. The lead frame 91 is integrating a element mounting portion 91a and a circuit portion 91b. This substrate is not limited to the lead frame, but it may be a similar metallic frame.

At above the element mounting portion 91a of the lead frame 91, a first semiconductor element 5 and a second semiconductor element 8 are stacked and mounted. Similarly, at below the element mounting portion 91a, a third semiconductor element 92 and a fourth semiconductor element 93 are stacked and mounted. The first and third semiconductor elements 5, 92 are adhered to the element mounting portion 91a via a first adhesive layer 6, respectively. The second and fourth semiconductor elements 8, 93 are adhered to the first and third semiconductor elements 5, 92 via an adhesive layer 9 of a two-layer structure, respectively.

Electrode pads of the first and third semiconductor elements 5, 92 are electrically connected to the element mounting portion 91a and the circuit portions (electrode portion) 91b of the lead frame 91 via bonding wires 7, respectively. The second and fourth semiconductor elements 8, 93 are electrically connected to the element mounting portion 91a and the circuit portions (electrode portion) 91b via bonding wires 13. The respective semiconductor elements 5, 8, 92, and 93 are sealed with the element mounting portion 91a and a part of the circuit portions 91b of the lead frame 91 by a sealing resin 14. The stacked-type semiconductor device 90 of a QFP type of a lead frame type is constituted by these.

According to the above-stated semiconductor device 90 of the seventh embodiment, a deformation of the bonding wire 7, a connection failure, and further a contact of the bonding wire 7 with the second and fourth semiconductor elements 8, 93, and so on, are prevented, and in addition, it is possible to adhere the second and fourth semiconductor elements 8, 93 on the first and third semiconductor elements 5, 92 well with low cost. Moreover, the adhesive layer 9 of the two-layer structure is formed by the same material, and therefore, a peeling between elements, and so on, after the adhesive process of the second and fourth semiconductor elements 8, 93 can be suppressed. Herewith, it becomes possible to realize a stacked-type semiconductor device 90 in which thin and improved reliability are both obtained, and in addition, the manufacturing cost is eliminated.

Incidentally, the present invention is not limited to the above-described respective embodiments, and it is applicable for the various stacked-type electronic components stacking and mounting a plurality of electronic components. As for the electronic components constituting the stacked-type electronic components, semiconductor components such as the above-stated semiconductor elements, package components, or circuit components, and so on, can be applied. Such stacked-type electronic components are also included in the present invention. The embodiment of the present invention can be changed or modified without departing from the range of the following claims, and it is to be understood that all the changes and modifications are to be included therein.

What is claimed is:

1. A method for manufacturing a stacked electronic component, comprising:
    adhering a first electronic component having first electrode pads on a substrate having electrode portions;
    connecting a first portion of the electrode portions and the first electrode pads via first bonding wires;
    adhering a second electronic component having second electrode pads on the first electronic component by using an adhesive layer structure including a first layer disposed at the first electronic component side and a second layer disposed at the second electronic component side; and
    connecting a second portion of the electrode portions and the second electrode pads via second bonding wires,
        wherein the first and second layers are made of a same material of thermosetting insulating resin, and the second layer has a modulus of elasticity larger than that of the first layer;
        wherein the first layer softens or melts at an adhesive temperature of the second electronic component, and has a viscosity within a range of 1 kPa·s or more and 100 kPa·s or less at the adhesive temperature, and the second layer maintains a layered shape for the adhesive temperature of the second electronic component, and has a viscosity of a range of 130 kPa·s or more at the adhesive temperature; and
        wherein ends of the first bonding wires connected to the second electrode pads are taken into a cured resin layer of the first layer, and a cured resin layer of the second layer is disposed between the first bonding wires and the second electronic component so as to prevent contact of the first bonding wires and the second electronic component.

2. The manufacturing method according to claim 1,
wherein the second electronic component has a portion protruding outside from an outer periphery of the first electronic component, and the first layer is filled between the protruding portions of the second electronic component and the substrate by softened or melted at the adhesive temperature of the second electronic component.

3. The manufacturing method according to claim 1,
wherein the first and second electronic components are constituted by at least one selected from a semiconductor element and a package component including a semiconductor element.

4. The manufacturing method according to claim 1,
wherein the first layer substantially covers the first electronic component, and the second layer substantially covers the second electronic component.

5. The manufacturing method according to claim 1,
wherein the first and second layers have a room temperature modulus of elasticity in a range of 500 MPa or more and 1200 MPa or less.

6. The manufacturing method according to claim 1,
wherein the adhesive layer has a modulus of elasticity at 175° C. of 40 MPa or more after cure, and a modulus of elasticity at 260° C. of 1 MPa or more after cure.

7. The manufacturing method according to claim 1,
wherein the first and second layers are made of an epoxy resin.

8. The manufacturing method according to claim 1,
wherein the second electronic component has a surface area the same as or larger than a surface area of the first electronic component.

9. A method for manufacturing a stacked electronic component, comprising:
adhering a first electronic component having first electrode pads on a substrate having electrode portions;
connecting a first portion of the electrode portions and the first electrode pads via first bonding wires;
adhering a second electronic component having second electrode pads on the first electronic component by using an adhesive layer structure having a first layer disposed adjacent to the first electronic component and a second layer disposed adjacent to the second electronic component; and
connecting a second portion of the electrode portions and the second electrode pads via second bonding wires,
wherein the first and second layers are made of a same material of thermosetting insulating resin, and the second layer has a modulus of elasticity larger than that of the first layer; and
wherein the first and second layers have a room temperature modulus of elasticity in a range of 500 MPa or more and 1200 MPa or less.

10. The manufacturing method according to claim 9, wherein the first layer substantially covers the first electronic component, and the second layer substantially covers the second electronic component.

11. The manufacturing method according to claim 9,
wherein ends of the first bonding wires connected to the second electrode pads are taken into a cured resin layer of the first layer, and a cured resin layer of the second layer is disposed between the first bonding wires and the second electronic component so as to prevent contact of the first bonding wires and the second electronic component.

12. The manufacturing method according to claim 9,
wherein the second electronic component has a surface area the same as or larger than a surface area of the first electronic component.

13. The manufacturing method according to claim 9,
wherein the first and second layers are made of an epoxy resin.

14. The manufacturing method according to claim 9,
wherein the first and second electronic components are constituted by at least one selected from a semiconductor element and a package component including a semiconductor element.

15. A method for manufacturing a stacked electronic component, comprising:
adhering a first electronic component having first electrode pads on a substrate having electrode portions;
connecting a first portion of the electrode portions and the first electrode pads via first bonding wires;
adhering a second electronic component having second electrode pads on the first electronic component by using an adhesive layer structure having a first layer disposed adjacent to the first electronic component and a second layer disposed adjacent to the second electronic component; and
connecting a second portion of the electrode portions and the second electrode pads via second bonding wires,
wherein the first and second layers are made of a same material of thermosetting insulating resin, and the second layer has a modulus of elasticity larger than that of the first layer; and
wherein the adhesive layer has a modulus of elasticity at 175° C. of 40 MPa or more after cure, and a modulus of elasticity at 260° C. of 1 MPa or more after cure.

16. The manufacturing method according to claim 15,
wherein the first layer substantially covers the first electronic component, and the second layer substantially covers the second electronic component.

17. The manufacturing method according to claim 15,
wherein ends of the first bonding wires connected to the second electrode pads are taken into a cured resin layer of the first layer, and a cured resin layer of the second layer is disposed between the first bonding wires and the second electronic component so as to prevent contact of the first bonding wires and the second electronic component.

18. The manufacturing method according to claim 15,
wherein the second electronic component has a surface area the same as or larger than a surface area of the first electronic component.

19. The manufacturing method according to claim 15,
wherein the first and second layers are made of an epoxy resin.

20. The manufacturing method according to claim 15,
wherein the first and second electronic components are constituted by at least one selected from a semiconductor element and a package component including a semiconductor element.

* * * * *